United States Patent
Lin et al.

(10) Patent No.: US 12,414,354 B2
(45) Date of Patent: Sep. 9, 2025

(54) SEMICONDUCTOR STRUTURES WITH DIELECTRIC FINS

(71) Applicant: Taiwan Semiconductor Manufacturing Company, Ltd., Hsinchu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1046 days.

(21) Appl. No.: 17/460,757

(22) Filed: Aug. 30, 2021

(65) Prior Publication Data
US 2023/0062379 A1   Mar. 2, 2023

(51) Int. Cl.
| | |
|---|---|
| *H10D 64/62* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 84/038* (2025.01); *H10D 84/0149* (2025.01); *H10D 84/0151* (2025.01); *H10D 84/834* (2025.01); *H10D 84/013* (2025.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

OTHER PUBLICATIONS

Huang, Chih-Fan et al., "MRAM Structure for Balanced Loading", U.S. Appl. No. 17/002,098, filed Aug. 25, 2020, Assignee: Taiwan Semiconductor Manufacturing Co., Ltd., Specification and Drawings, 33 pages.

*Primary Examiner* — Steven B Gauthier
*Assistant Examiner* — Lamont B Koo
(74) *Attorney, Agent, or Firm* — Cooper Legal Group, LLC

(57) ABSTRACT

Semiconductor structures and methods of forming the same are provided. A method according to an embodiment includes receiving a workpiece comprising a first semiconductor element and a second semiconductor element, and a dielectric fin disposed between the first semiconductor element and the second semiconductor element. The method also includes forming a masking layer directly over the dielectric fin, etching the first semiconductor element and the second semiconductor element to form a first recess and a second recess, and forming a first source/drain feature and a second source/drain feature in the first recess and the second recess, respectively. By employing a masking layer and patterning the masking layer to have different widths, a parasitic resistance and a parasitic capacitance of the semiconductor structure may be adjusted accordingly, and undesirably bridging between two adjacent epitaxial source/drain features may be prevented.

20 Claims, 23 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,483,378 B2 | 11/2019 | Ching et al. |
| 10,872,891 B2 | 12/2020 | Lin et al. |
| 10,971,605 B2 | 4/2021 | Ching et al. |
| 2016/0233298 A1 | 8/2016 | Webb et al. |
| 2020/0105581 A1* | 4/2020 | Chang ............... H01L 21/76224 |
| 2020/0126798 A1* | 4/2020 | Lin ..................... H10D 64/017 |

* cited by examiner

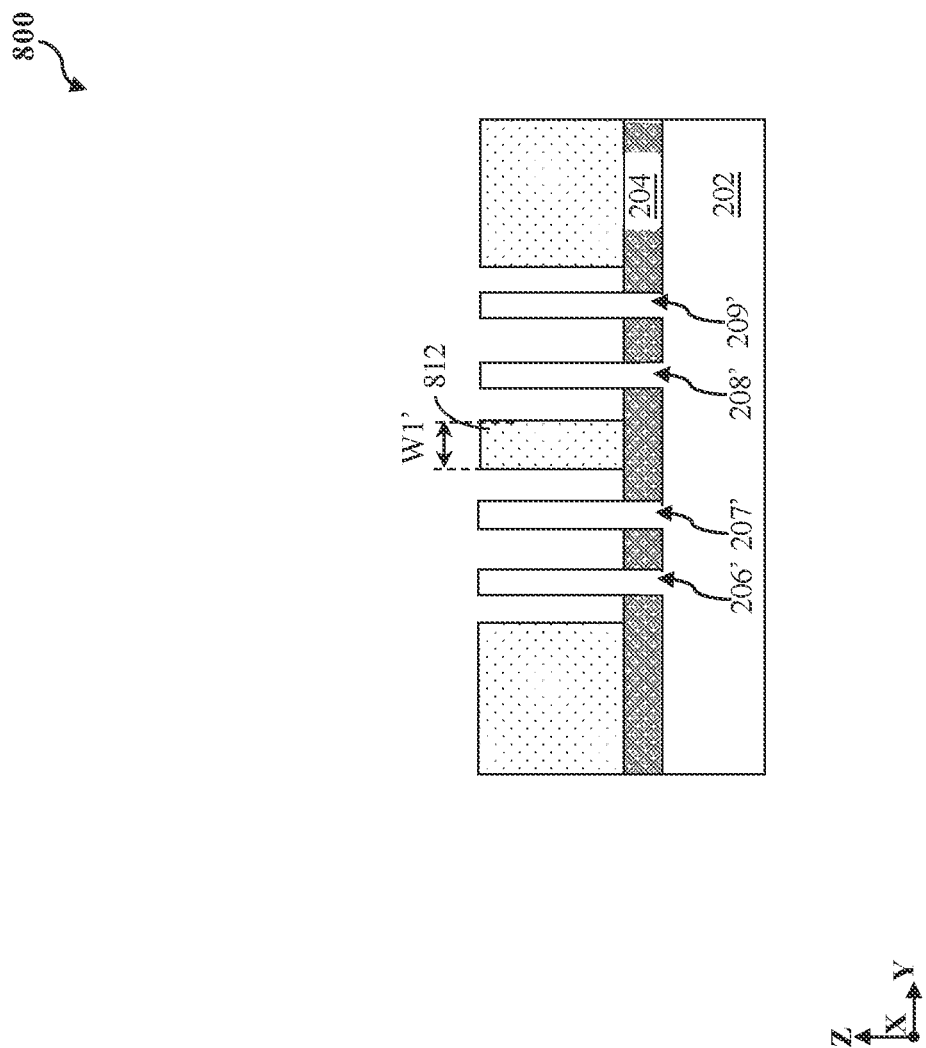

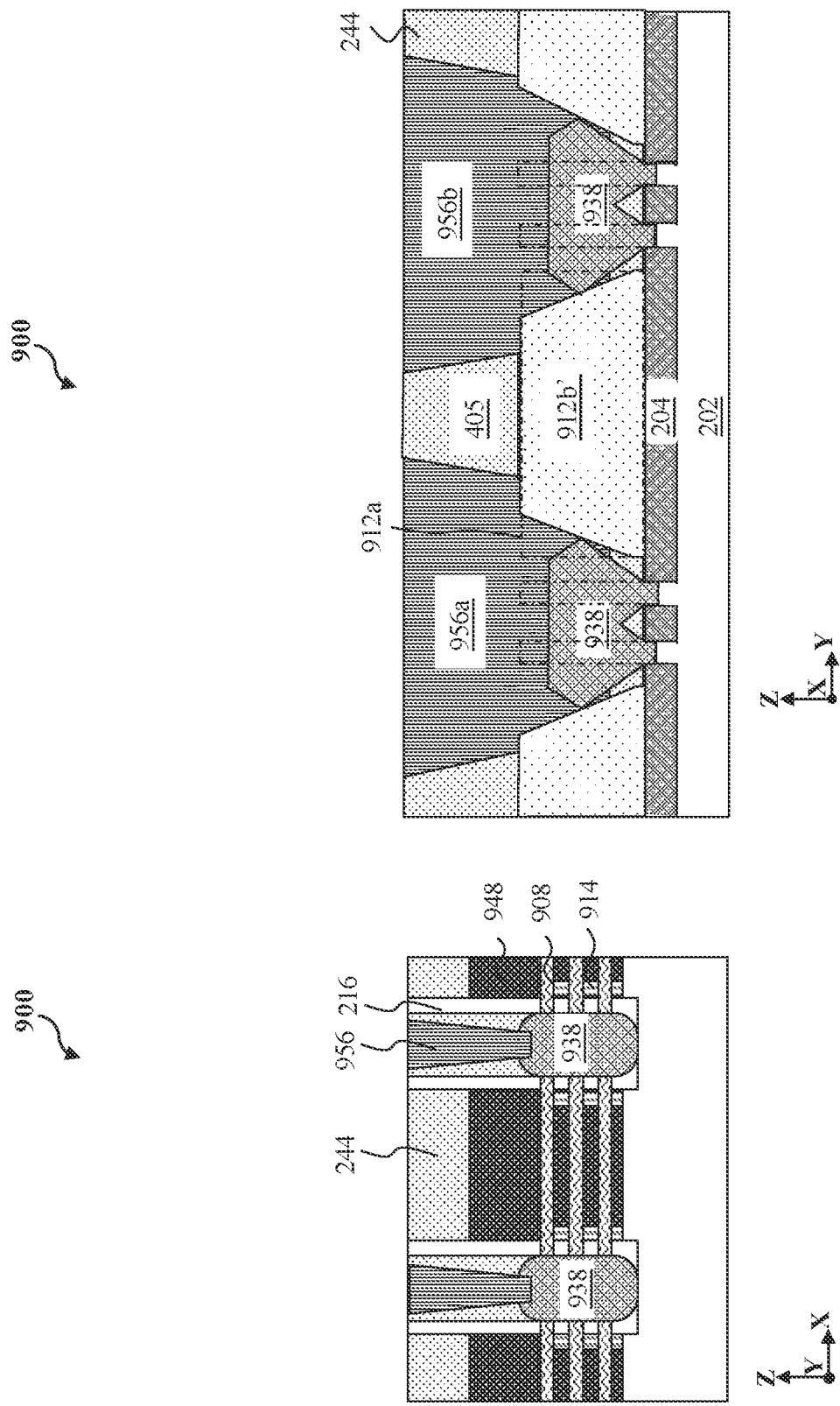

SEMICONDUCTOR STRUTURES WITH DIELECTRIC FINS

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

The scaling down also gives rise to various challenges. For example, dielectric fins may be implemented to isolate adjacent source/drain features or divide a source/drain contact into two segments. The dielectric fin is to withstand etching when the source/drain features are recessed. While existing dielectric fins and source/drain region recess processes are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 16A, 16B, and 16C illustrate a sixth alternative embodiment of the semiconductor structure, according to one or more aspects of the present disclosure.

FIGS. 17A and 17B illustrate another alternative embodiment of the semiconductor structure having multi-bridge-channel (MBC) transistors, according to one or more aspects of the present disclosure.

DETAILED DESCRIPTION

Figure 1:
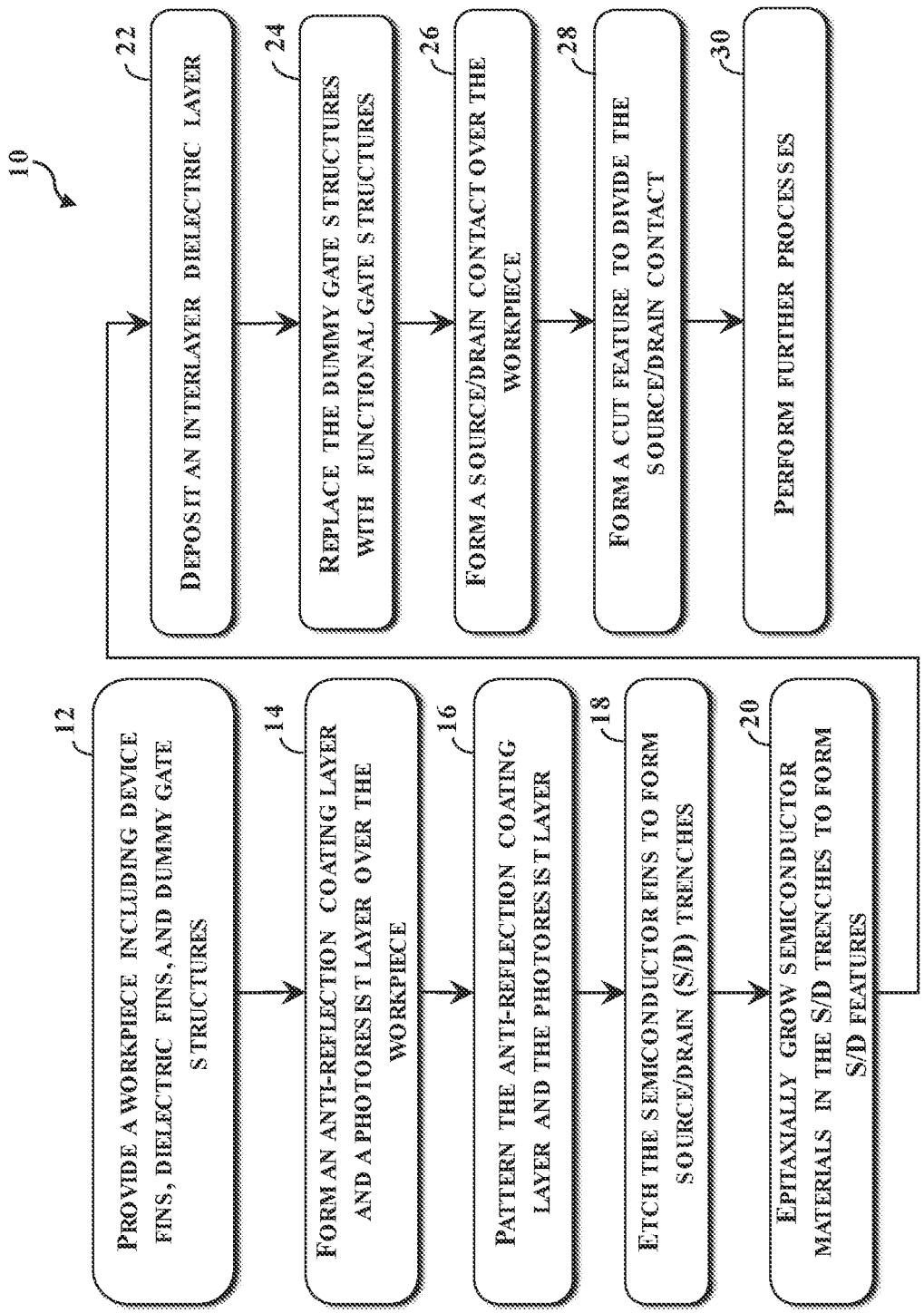
FIG. 1 depicts a flowchart of an exemplary method for fabricating a semiconductor structure in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Despite the advantages, existing multi-gate devices may still need improvements. For example, multi-gate devices may include dielectric structures to prevent the bridging of adjacent epi-layers. During the fabrication of the multi-gate devices such as FinFET devices, such dielectric structures for existing FinFET devices either cannot fully prevent the bridging between the adjacent epi-layers, or they may be undesirably etched, leading to increased parasitic capacitance.

The present disclosure relates to a method for forming a semiconductor structure to prevent the bridging of adjacent epitaxial source/drain features and to adjust parasitic capacitance and parasitic resistance of the semiconductor structure. The method of the present disclosure includes forming a dielectric fin disposed between two adjacent active regions and selectively etching the dielectric fin to have a predetermined volume. In some embodiments, a masking layer may be formed and patterned to have different configurations (e.g., shape, width, and/or thickness) over a corresponding region of the dielectric fin such that the dielectric fin can achieve the predetermined volume after the etching process. By adjusting the configuration of patterned masking layer over the dielectric fin, the parasitic resistance associated with source/drain features and the parasitic capacitance between to-be-formed source/drain contacts and gate structures may be adjusted accordingly.

Figure 18:
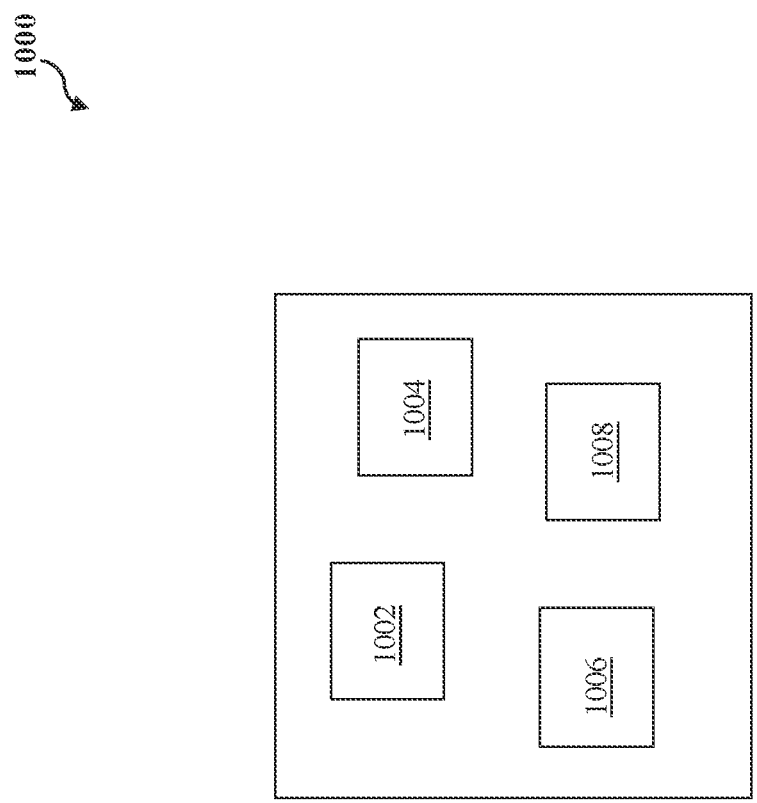
FIG. 18 illustrates a schematic diagram of an exemplary integrated circuit including multiple semiconductor devices, according to various aspects of the present disclosure.

The various aspects of the present disclosure will now be described in more detail with reference to the figures. In that regard, FIG. 1 is a flowchart illustrating a method 10 for fabricating a semiconductor structure according to embodiments of the present disclosure. FIG. 10 is a flowchart illustrating a method 300 for determining a configuration of a patterned masking layer to be used during an exemplary operation in the method 10 of FIG. 1 according to various aspects of the present disclosure. Method 10 and method 300 are described below in conjunction with FIGS. 3A-3B, 4A-4B, 5A-5B, 6A-6B, 7A-7B, 8A-8B, 9A-9B, 11A-11B, 12, 13, 14A-14B, 15A-15B, 16A-16C, and 17A-17B, which are diagrammatic fragmentary cross-sectional views of semiconductor structures at different stages of fabrication or in various alternative embodiments according to one or more aspects of the present disclosure. FIG. 18 is a schematic diagram of an exemplary integrated circuit including multiple semiconductor devices according to various aspects of the present disclosure. Methods 10 and 300 are merely examples and are not intended to limit the present disclosure to what is explicitly illustrated in method 10 and/or method 300. Additional steps can be provided before, during, and after method 10 and/or method 300, and some steps described can be replaced, eliminated, or moved around for additional embodiments of the method. Not all steps are described herein in detail for reasons of simplicity. For avoidance of doubts, throughout the figures, the X direction is perpendicular to the Y direction and the Z direction is perpendicular to both the X direction and the Y direction.

Referring to FIGS. 1-2 and 3A-3B, method 10 includes a block 12 where a workpiece 200 is provided. Because a semiconductor structure will be formed from the workpiece 200, workpiece 200 may be referred to as semiconductor device 200 or semiconductor structure 200 in suitable context. Referring to the example of FIGS. 2 and 3A-3B, the semiconductor device 200 includes a substrate 202 and various features formed thereon. In the depicted embodiment, the substrate 202 includes silicon (Si). Alternatively or additionally, the substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using implantation of oxygen (SIMOX), wafer bonding, and/or other suitable methods. The substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

Figure 2:
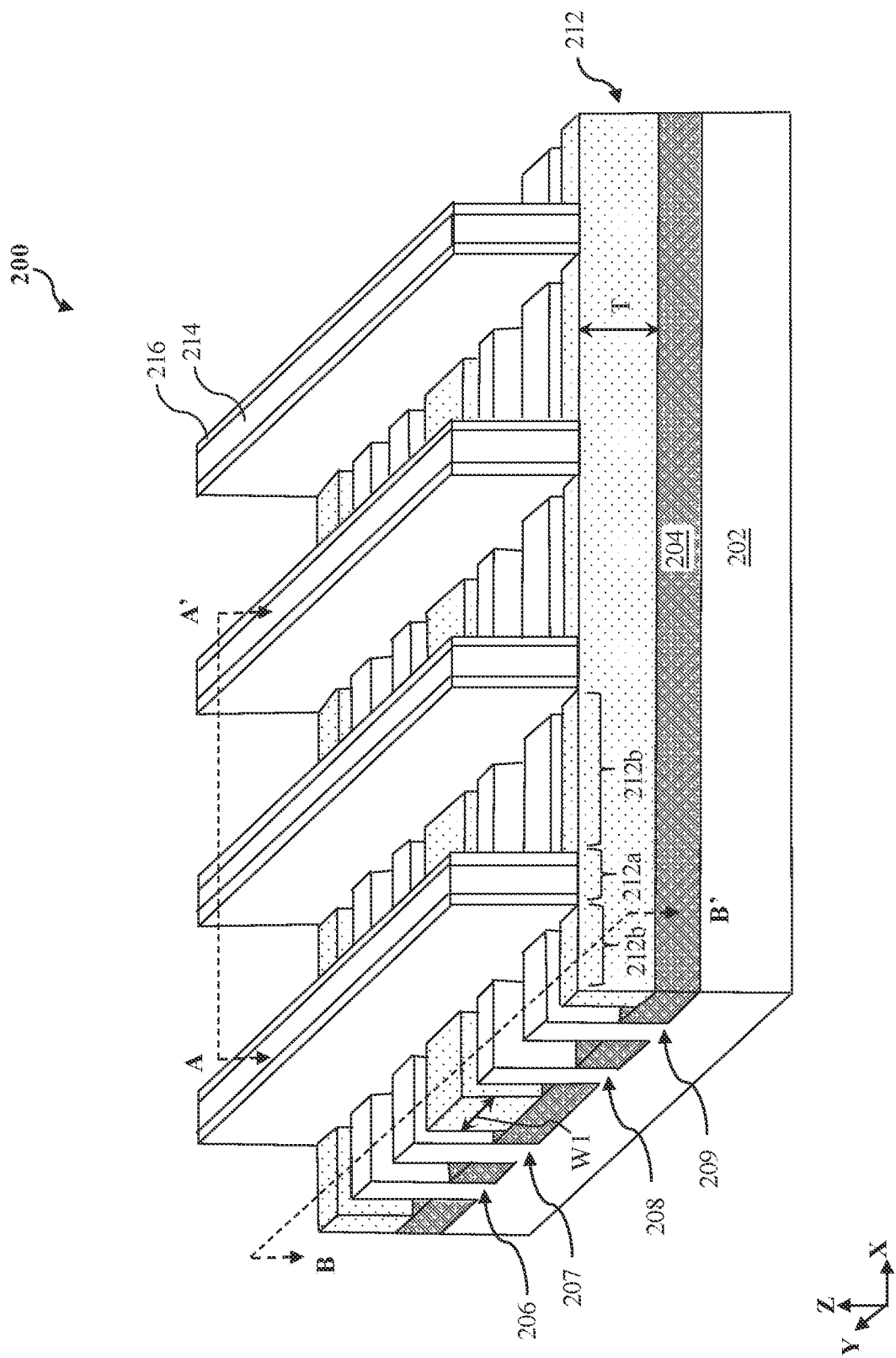
FIG. 2 illustrates a three-dimensional (3D) perspective view of an exemplary workpiece to undergo various stages of operations in the method of FIG. 1, according to various aspects of the disclosure.
Figures 3A, 3B:
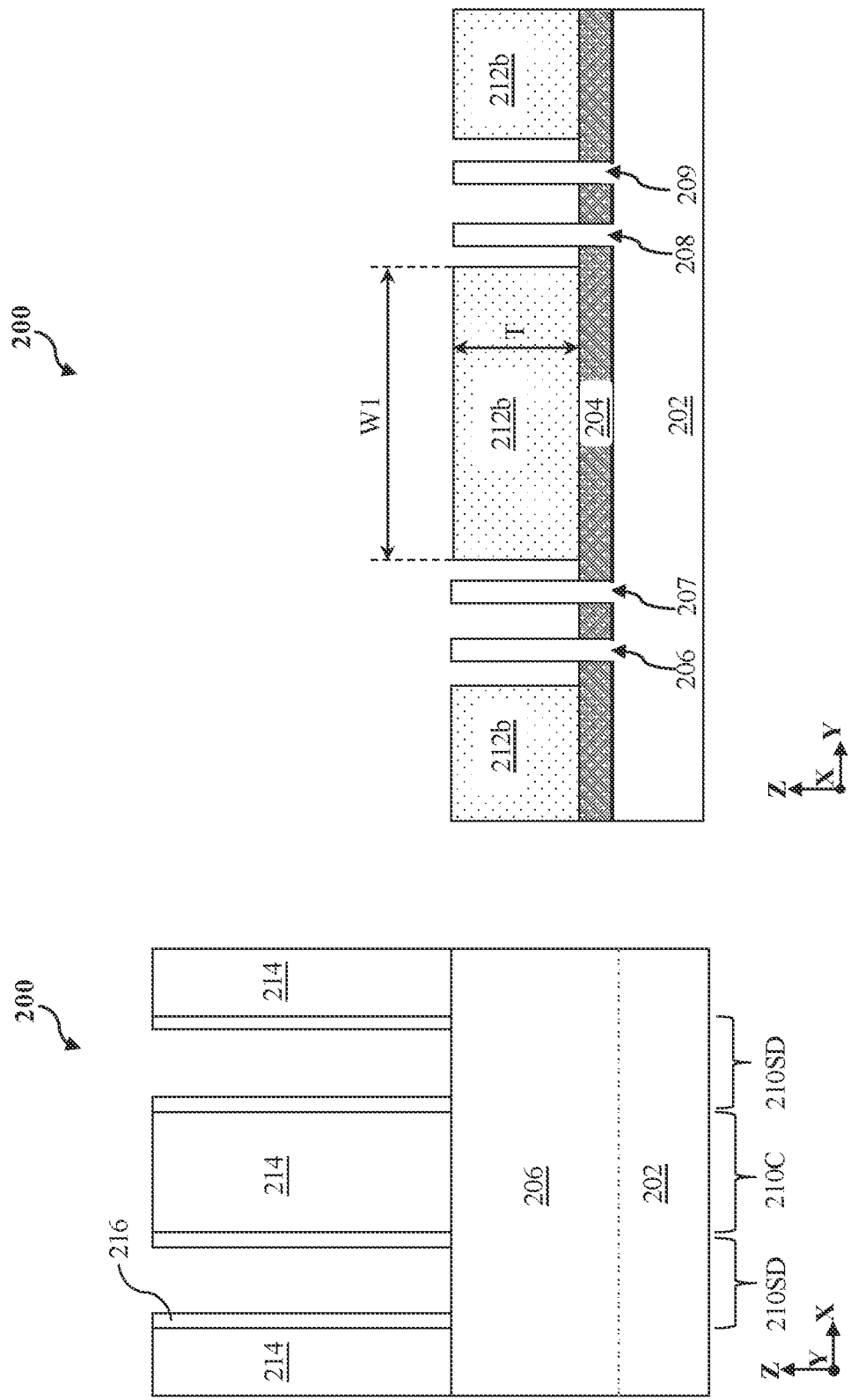
FIGS. 3A, 4A, 5A, 6A, 7A, 8A, and 9A illustrate cross-sectional views of the workpiece taken along line A-A' as shown in FIG. 2 undergoing various stages of operations in the method of FIG. 1, according to various aspects of the present disclosure.
FIGS. 3B, 4B, 5B, 6B, 7B, 8B, and 9B illustrate cross-sectional views of a portion of the workpiece taken along line B-B' as shown in FIG. 2 undergoing various stages of operations in the method of FIG. 1, according to various aspects of the present disclosure.

As shown in FIG. 2, the workpiece 200 includes a plurality of semiconductor fins (or fin elements) such as fin 206, fin 207, fin 208, and fin 209 disposed on the substrate 202. In some embodiments, the fins 206-209 may be formed from patterning a portion of the substrate 202. In some alternative embodiments, the plurality of fins 206-209 may be formed from patterning one or more epitaxial layers deposited over the substrate 202. The fins 206-209 each vertically protrude along the Z direction, extend in an elongated manner along the X direction, and are separated from one another along the Y direction, as shown in FIG. 2. For ease of reference, the fins 206-209 may be interchangeably referred to as device fins 206-209 hereinafter, to be differentiated from the dielectric fins 212 discussed below. Referring to FIG. 3A, the device fins 206-209 each include a channel region 210C and a source/drain region 210SD adjacent to the channel region 210C. The channel region 210C is wrapped over by and underlies a dummy gate structure 214 while the source/drain region 210SD is not overlapped by the dummy gate structure 214. As will be described further below, source/drain features are to be formed in the source/drain region 210SD. In some implementations, device fins may be disposed in groups to form double fin devices. For example, as illustrated in FIG. 3B, device fins 206 and 207 belong to one group and the device fins 208 and 209 belong to another.

Still referring to FIG. 2 and FIGS. 3A-3B, an isolation feature 204 (e.g., shallow trench isolation (STI)) is disposed between the plurality of the device fins 206-209 and over the substrate 202 to separate adjacent device fins. In some embodiments, the isolation feature 204 may include silicon oxide, silicon nitride, silicon oxynitride, fluorine-doped silicate glass (FSG), a low-k dielectric, combinations thereof, and/or other suitable materials. Dielectric fins 212 (or dummy fins 212), each having a thickness T (also referred to as a height T) along the Z direction, are disposed between the plurality groups of the device fins 206-209 and over the isolation feature 204. The thickness T may be between about 30 nm and about 70 nm. Top surfaces of the dielectric fins 212 and the device fins 206-209 may be coplanar. Dielectric fins 212 may several purposes. For example, the dielectric fins 212 may separate adjacent source/drain features, serve a part of a gate cut structure, or serve as a part of a source/drain contact cut structure. Each of the dielectric fins 212 may be a single layer or a multi-layer. In some instances, the dielectric fins 212 may include silicon nitride, silicon carbonitride, silicon oxycarbide, silicon oxycarbonitride, or a high-k dielectric such as hafnium oxide, zirconium oxide, and lanthanum oxide. The dielectric fin 212 includes a first region 212a wrapped over by the dummy gate structure 214 and a second region 212b adjacent to the first region 212a. That is, the first region 212a of a dielectric fin 212 is similarly situated as a channel region 210C of the device fins 206-209 while the second region 212b is similarly situated as a source/drain region 210SD of the device fins 206-209. As will be described below, during the source/drain region recess processes, the first regions 212a and channel regions 210C are protected by the dummy gate structure 214 and the second regions 212b and source/drain regions 210SD are not protected by the dummy gate structure 214.

Still referring to FIG. 2 and FIGS. 3A-3B, the workpiece 200 includes dummy gate structures 214 disposed over channel regions 210C (shown in FIG. 3A) of the device fins 206-209 and the first region 212a (shown in FIG. 2) of the dielectric fin 212. While not explicitly shown in the figures, each of the dummy gate structures 214 may include a dummy gate dielectric layer and a dummy gate electrode over the dummy gate dielectric. The dummy dielectric layer may include silicon oxide, the dummy gate electrode layer may include polysilicon. Sidewalls of the dummy gate structures 214 are lined with gate spacers 216. In some embodiments, the gate spacers 216 may include silicon carbonitride, silicon oxycarbide, silicon oxycarbonitride, or silicon nitride.

Figures 4A, 4B:
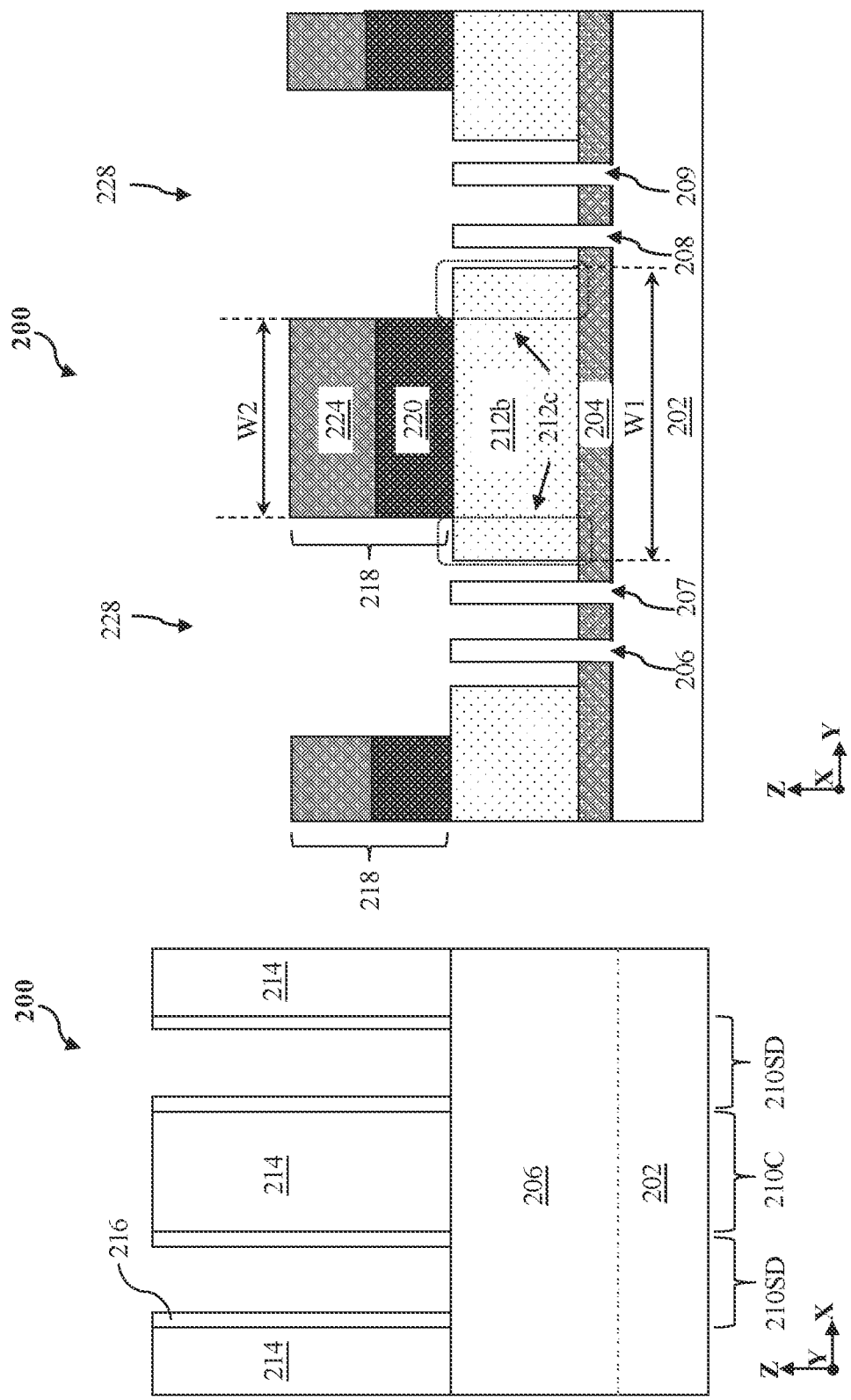

Referring to FIGS. 1 and 4A-4B, method 10 includes a block 14 where a masking layer 218 is formed over the workpiece 200. In this depicted example, the masking layer 218 includes a bottom anti-reflective coating (BARC) layer 220 formed over the workpiece 200 and a photoresist layer 224 formed over the BARC layer 220. The BARC layer 220 may be formed of an organic material, such as polysulfones, polyureas, polyurea sulfones, polyacrylates, or poly(vinyl pyridine). The photoresist layer 224 may include photosensitive materials that causes the layer to undergo a property change when exposed to light, such as ultraviolet (UV) light, deep UV (DUV) light, and/or extreme UV (EUV) light. Other suitable materials may also be used as the masking layer 218. For example, the masking layer 218 may be a hard mask that may include silicon oxide or silicon nitride.

Still referring to FIGS. 1 and 4A-4B, method 10 includes a block 16 where the masking layer 218 is patterned, by lithography process, to leave a portion of masking layer disposed directly over the workpiece 200. An exemplary lithography process includes spin-on coating the photoresist layer 224, soft baking of the photoresist layer 224, mask aligning, exposing, post-exposure baking, developing the photoresist layer 224, rinsing, and drying (e.g., hard baking). Alternatively, a lithographic process may be implemented, supplemented, or replaced by other methods such as maskless photolithography, electron-beam writing, and ion-beam writing. After the photoresist layer 224 is patterned, the BARC layer 220 is etched using the patterned photoresist layer 224 as an etch mask to form the patterned masking layer 218. In this depicted example, the patterned masking layer 218 has a width W2 (along the Y direction) less than the width W1 of the dielectric fin 212. As shown in FIG. 4B, the patterned masking layer 218 covers a portion of the second region 212b of the dielectric fin 212, a center line (not shown) of the patterned masking layer 218 aligns with a center line (not shown) of the second region 212b of dielectric fin 212. The source/drain regions 210SD of the device fins 206-209 and uncovered portion 212c of the second region 212b are exposed in openings 228 formed during the patterning process. In some other implementations, the patterned masking layer 218 may have other configurations such as the width W2 of the patterned masking layer 218 may be greater than the width W1 of the dielectric fin 212, and/or there is an offset between the center line of the second region 212b of the dielectric fin 212 and the center line of the patterned masking layer 218 over the substrate 202. The covered portion and uncovered portion of the second region 212b of dielectric fin 212 may be changed accordingly. An exemplary method of determining the configuration of the patterned masking layer 218 would be described in detail with reference to FIG. 10 in conjunction with FIGS. 11A-11B, 12, 13, 14A-14B, 15A-15B, 16A-16C, and 17A-17B.

Figures 5A, 5B:
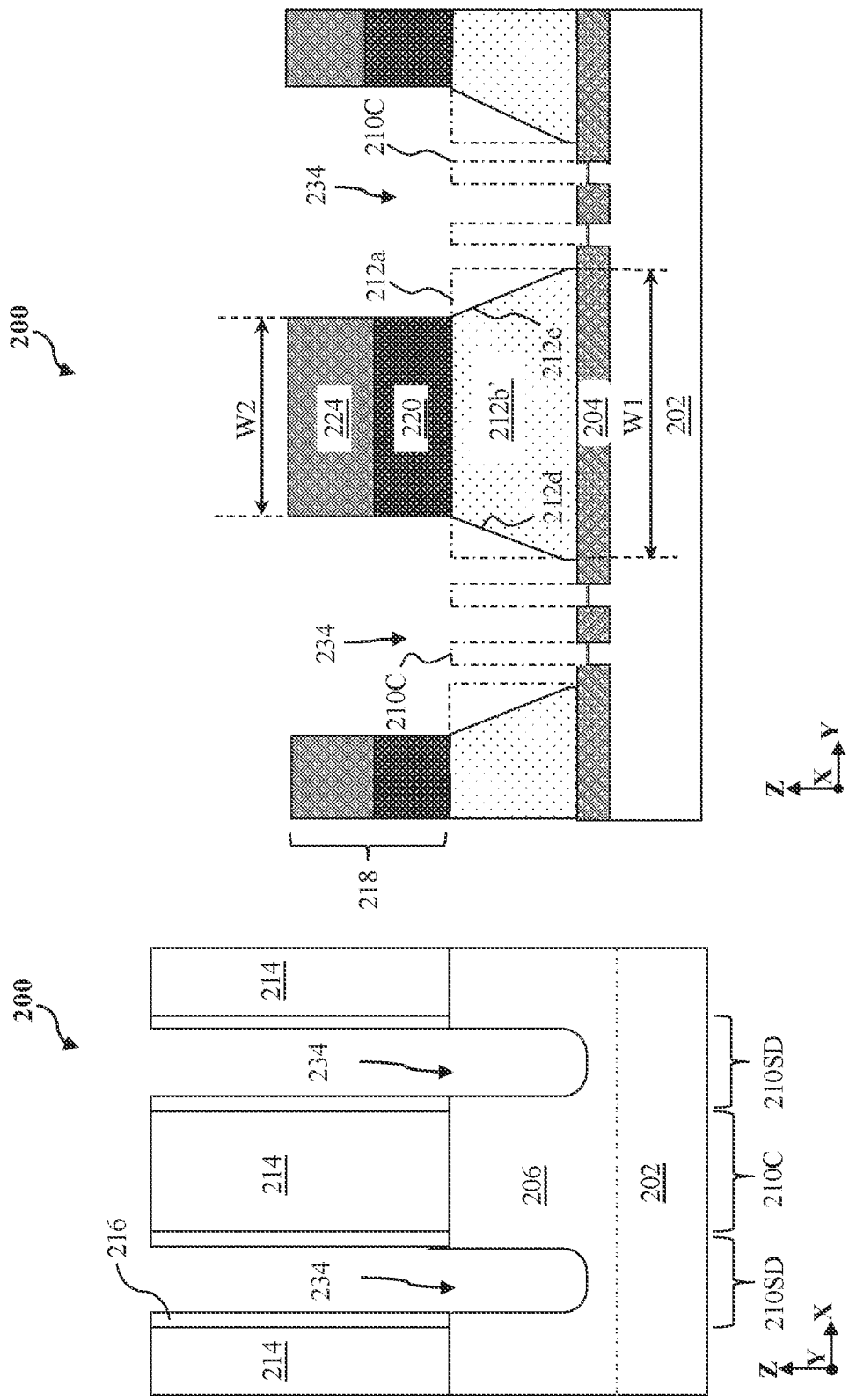

Referring to FIGS. 1 and 5A-5B, method 10 includes a block 18 where source/drain regions 210SD of the device fins 206-209 are recessed by one or more etching processes to form corresponding source/drain trenches 234. The one or more etching processes may include any suitable etching technique such as dry etching, wet etching, and/or other etching methods (e.g., reactive ion etching (RIE)). The etching technique including the etchant chemistry may be configured to avoid significant etching of the photoresist layer 224. After the one or more etching processes, the corresponding channel regions 210C and the first region 212a (shown in dashed line in FIG. 5B) covered by the dummy gate structure 214 remain substantially intact. Although the material of forming dielectric fin 212 may be different from that of the device fins 206-209 to provide etch selectivity during the formation of source/drain trenches 234, a part of the uncovered portion 212c of the dielectric fin 212 may be partially removed, thus forms a recessed second region 212b' (may be interchangeably referred to as recessed dielectric fin 212b' hereinafter), a volume V of the recessed dielectric fin 212b' is less than a volume of the second region 212b. The volume V of the recessed dielectric fin 212b' is a function of the configuration (e.g., width along the Y direction) of the patterned masking layer 218 disposed over the original second region 212b of the dielectric fin 212. In some embodiments, the volume V of the recessed dielectric fin 212b' is also a function of the etching processes employed at the block 18 of method 10 in FIG. 1. Since the second region 212b of dielectric fin 212 has been partially etched, a space for forming source/drain features are enlarged. In this depicted example, a shape of the cross-sectional review of the recessed dielectric fin 212b' includes a trapezoid. That is, the recessed dielectric fin 212b' includes two tapered sidewalls 212d and 212e, when view along the X direction. The patterned masking layer 218 may be removed after the formation of the source/drain trenches 234.

Figure 6B:
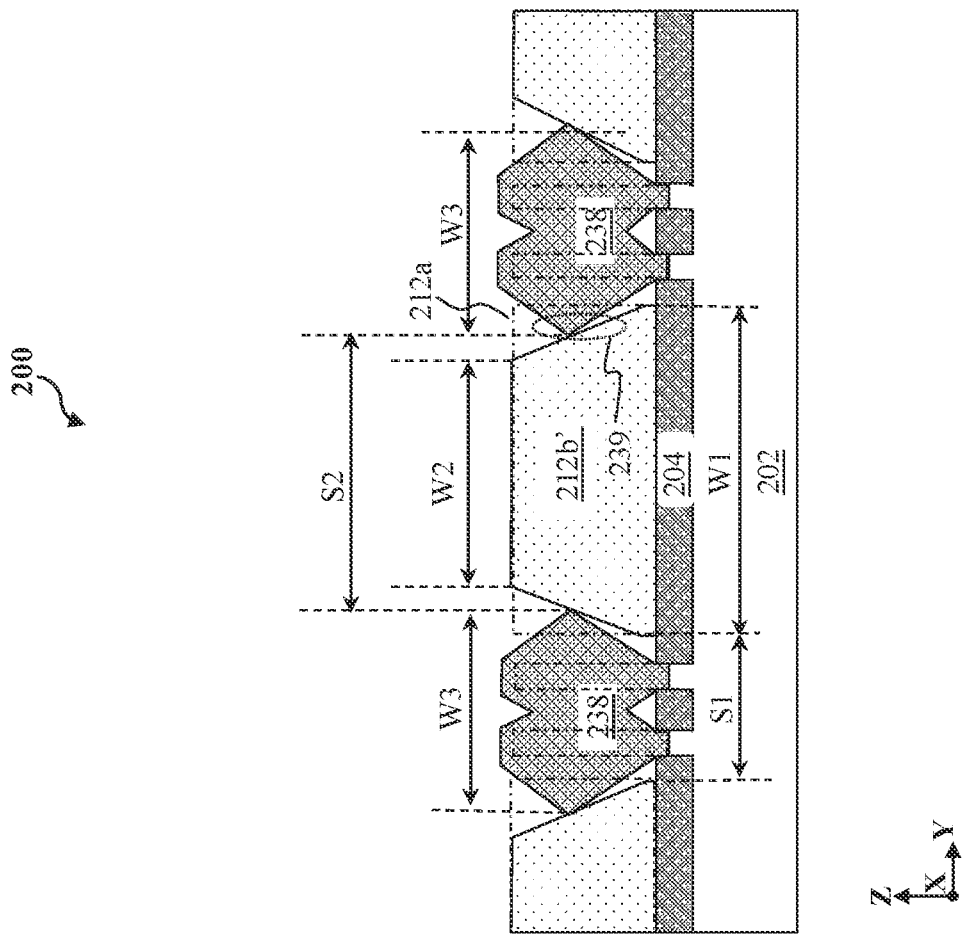
Figure 6A:
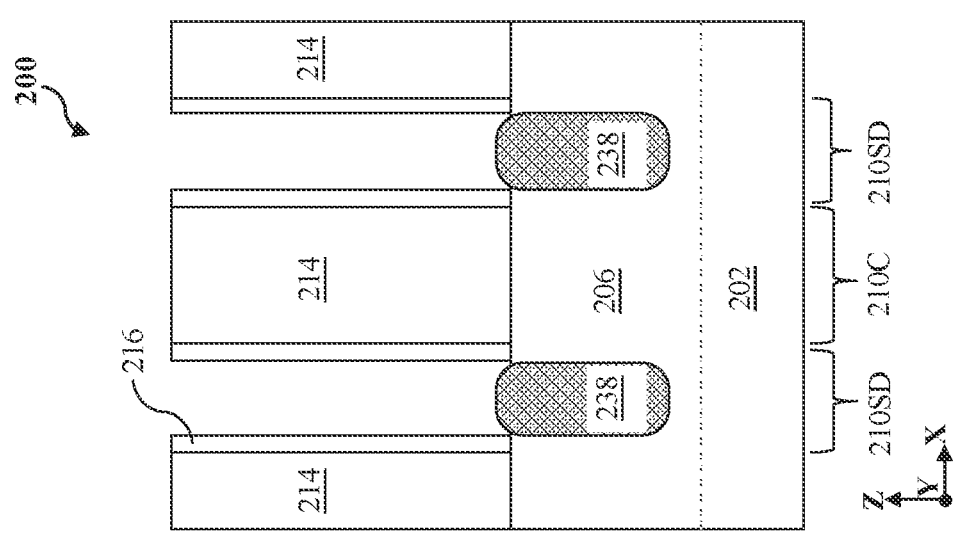

Referring to FIGS. 1 and 6A-6B, method 10 includes a block 20 where an epitaxial growth process is performed to the workpiece 200 to epitaxially grow source/drain features 238 in the source/drain trenches 234. The source/drain features 238 may be formed vapor-phase epitaxy (VPE), ultra-high vacuum chemical vapor deposition (UHV-CVD), low pressure vapor deposition (LPCVD), and/or plasma-enhanced chemical vapor deposition (PECVD), molecular beam epitaxy (MBE), or other suitable epitaxy processes, or combinations thereof. The epitaxial growth process allows the source/drain features 238 to grow from the exposed top surfaces of the recessed device fins in the source/drain regions 210SD and exposed sidewalls of the recessed device fins in the channel region 210C. The source/drain features 238 may also be referred to as epitaxial source/drain features. Depending on the design of the semiconductor device 200, source/drain features 238 may be n-type or p-type. When the source/drain features 238 are n-type, they may include silicon (Si) doped with an n-type dopant, such as phosphorus (P) or arsenic (As). When the source/drain features 238 are p-type, they may include silicon germanium (SiGe) doped with a p-type dopant, such as boron (B) or gallium (Ga). In some implementations, annealing processes may be performed to activate dopants in source/drain features 238 of the semiconductor device 200. As shown in FIG. 6B, at least a portion 239 of the source/drain feature 238 is disposed directly over the tapered sidewalls 212d-212e of the recessed dielectric fin 212b'. A width W3 (along the Y direction) of the source/drain feature 238 is greater than a distance S1 between bottom edges of the recessed dielectric fins 212b', a distance S2 between two adjacent source/drain features 238 is smaller than the width W1 of the dielectric fin 212.

Figures 7A, 7B:
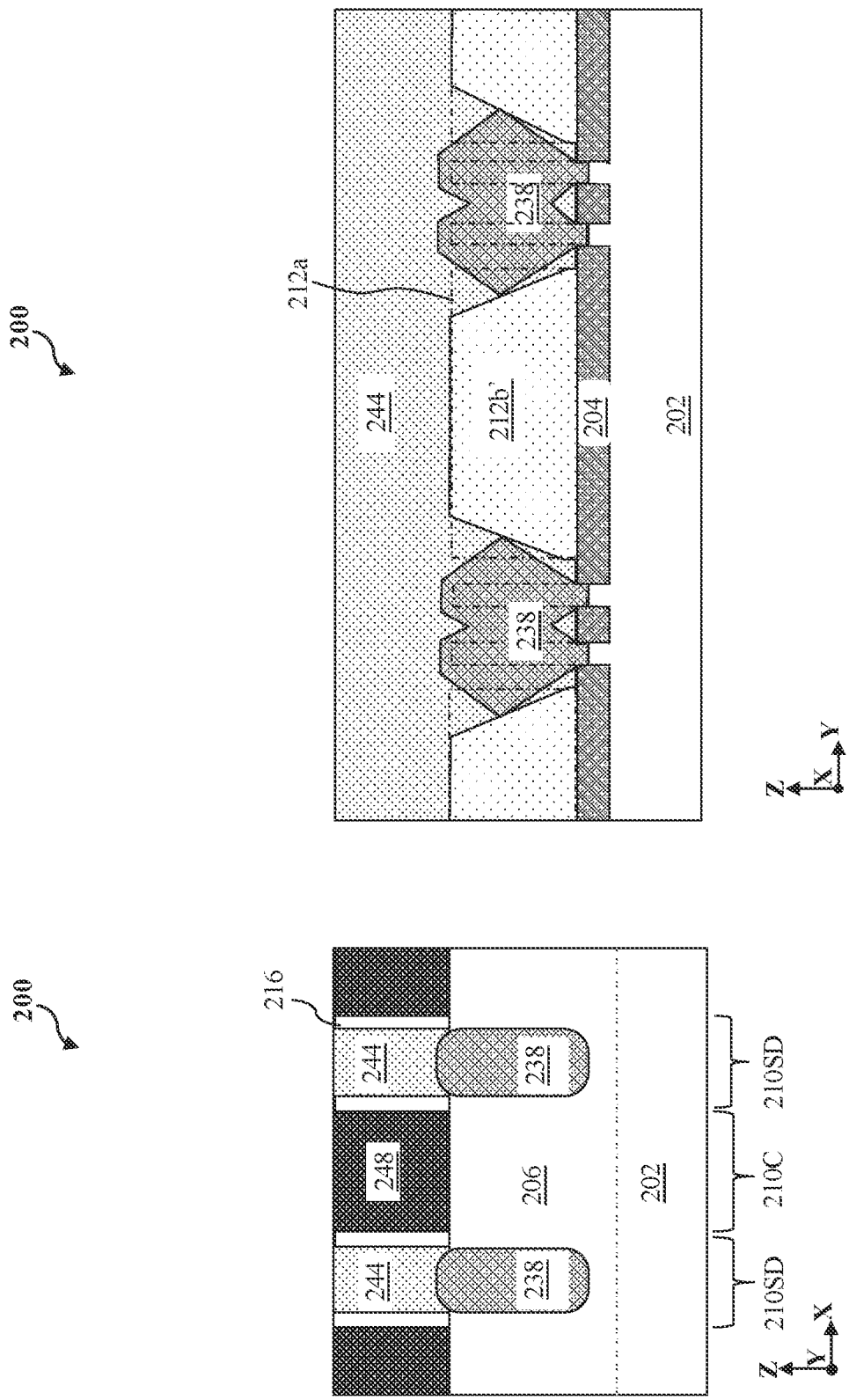

Referring to FIGS. 1 and 7A-7B, method 10 includes a block 22 where a bottom interlayer dielectric (ILD) layer 244 is formed over the workpiece 200. The bottom ILD layer 244 may include silicon oxide, silicon nitride, silicon oxynitride, tetraethylorthosilicate (TEOS) formed oxide, phosphosilicate glass (PSG), borophosphosilicate glass (BPSG), fused silica glass (FSG), boron doped silicon glass (BSG), and/or other suitable dielectric materials. The bottom ILD layer 244 may be deposited by CVD, spin-on coating, or other suitable deposition technique.

Still referring to FIGS. 1 and 7A-7B, method 10 includes a block 24 where the dummy gate structures 214 are replaced by functional gate structures 248. Chemical mechanical polishing (CMP) process may be performed to planarize the bottom ILD layer 244 and the gate spacer 216 to expose top surfaces of the dummy gate structure 214. One or more patterned hard masks (not shown) may be formed on the bottom ILD layer and expose the dummy gate structure 214. One or more etching processes may be performed to remove the dummy gate structure 214 to form a gate trench (not explicitly shown). The etching process may include one or more iterations of various etching techniques, such as wet etching, dry etching, RIE. The forming of the functional gate structure 248 in the gate trench begins by forming a gate dielectric layer (not separately labeled). The gate dielectric layer may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide (k≈3.9). Exemplary high-k dielectric materials for the high-k dielectric layer include hafnium oxide, titanium oxide, hafnium zirconium oxide, tantalum oxide, hafnium silicon oxide, zirconium silicon oxide, lanthanum oxide, aluminum oxide, yttrium oxide, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

A gate electrode (not separately labeled) is then formed over the gate dielectric layer. The gate electrode may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof.

Figures 8A, 8B:
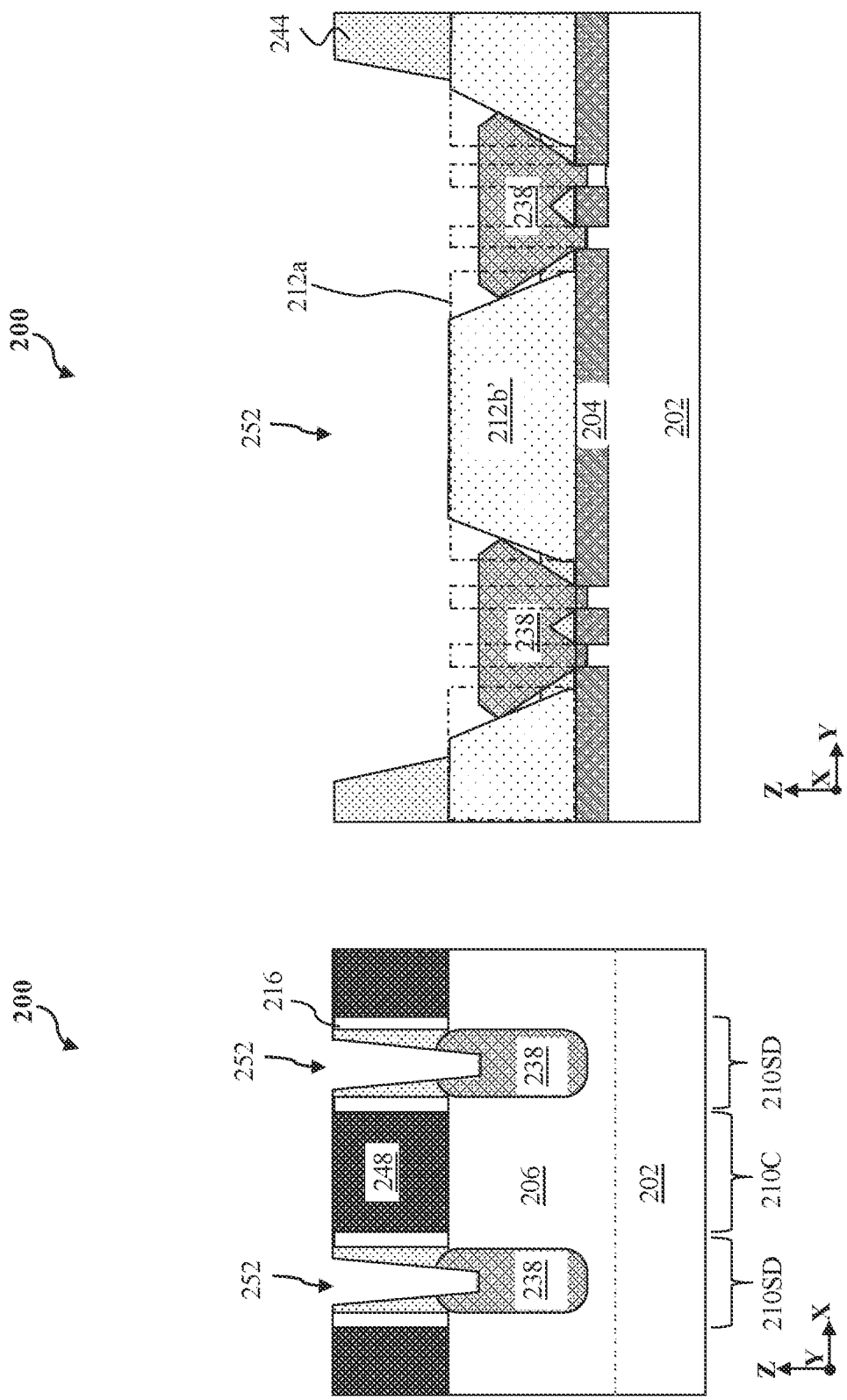
Figure 9B:
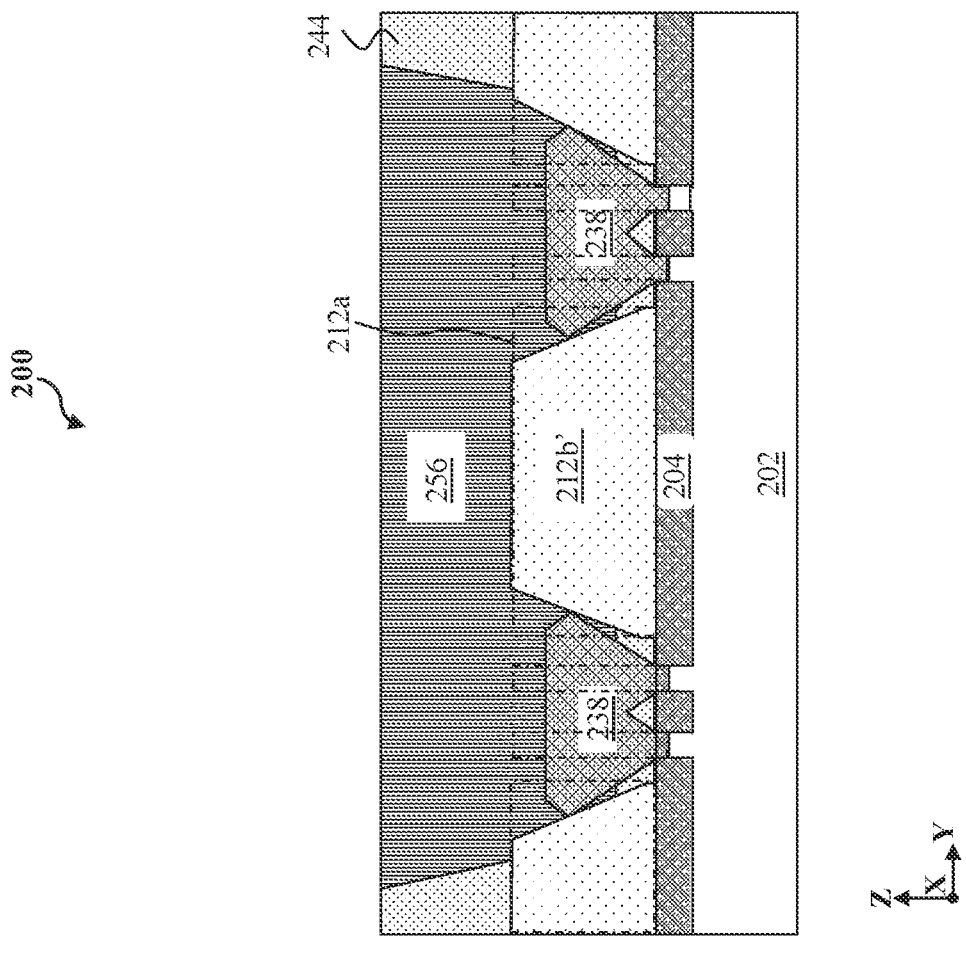
Figure 9A:
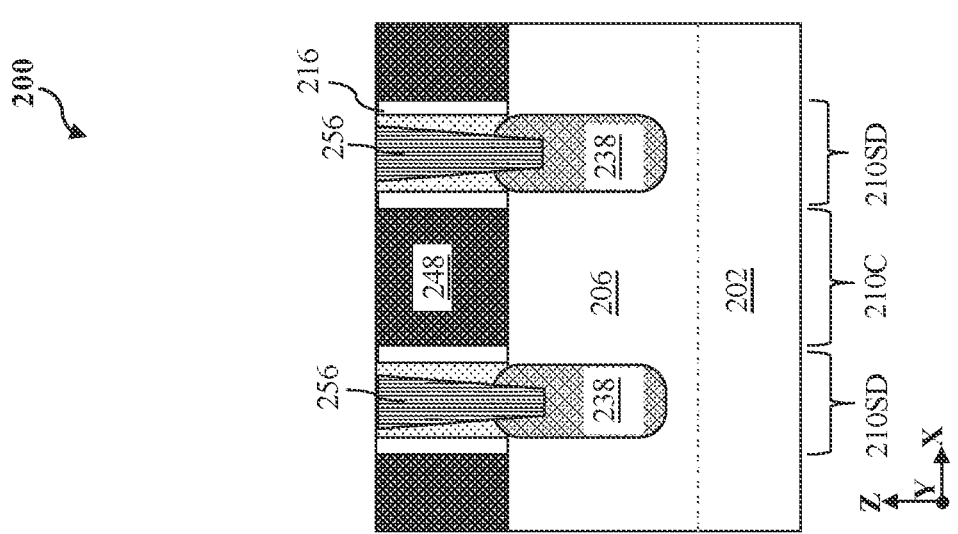
Figure 10:
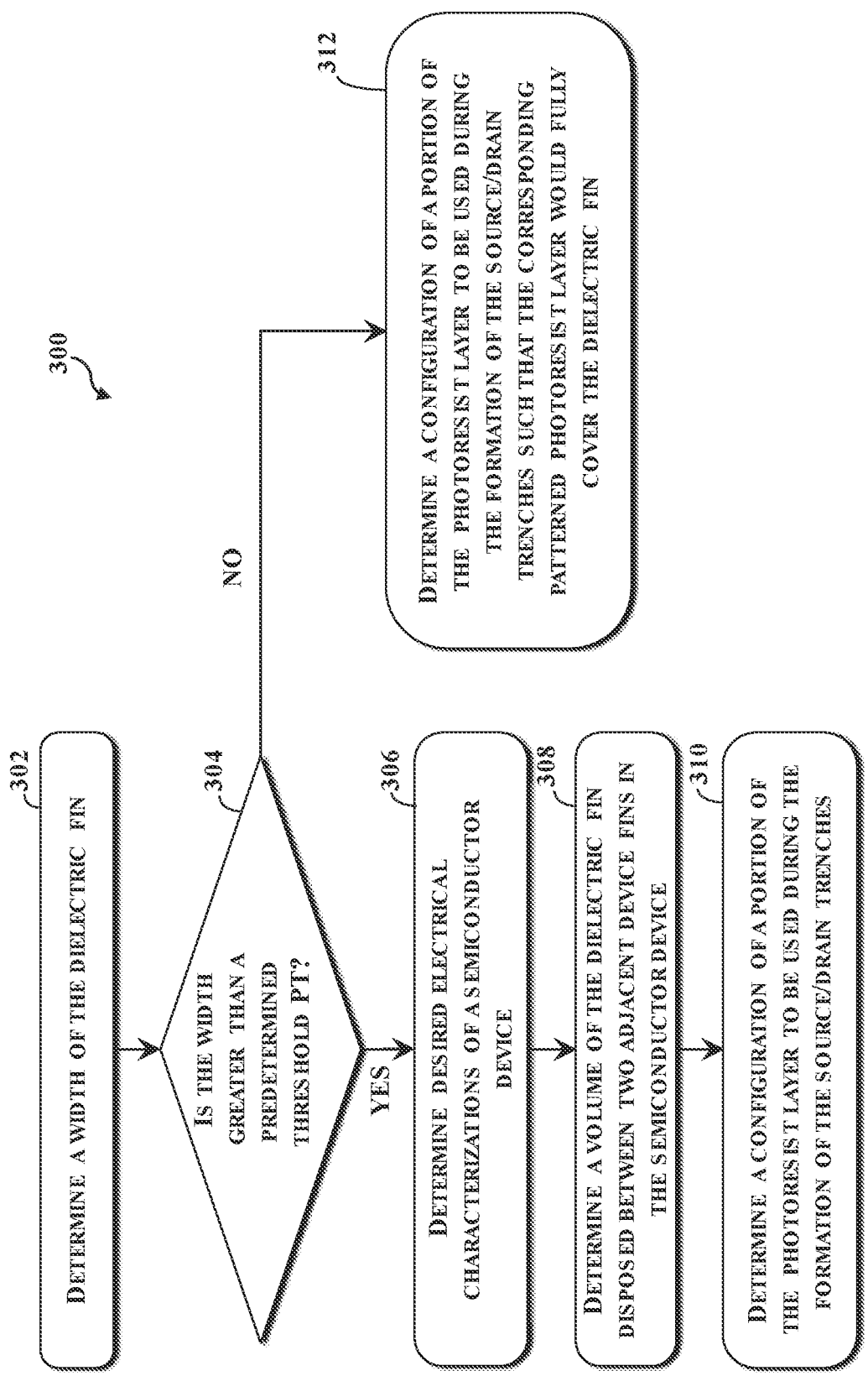
FIG. 10 is a flowchart of an exemplary method for determining a configuration of a patterned masking layer to be used in an operation described in the method of FIG. 1, according to various aspects of the present disclosure.

Referring to FIGS. 1, 8A-8B, and 9A-9B, method 10 includes a block 26 where source/drain contacts are formed over the substrate 202. The formation of source/drain contacts 256 includes multiple processes. With reference to FIGS. 8A-8B, one or more contact openings 252 are formed in the bottom ILD layer 244 to expose the source/drain features 238. In some embodiments, the contact openings 252 may be formed by etching the bottom ILD layer 244. In some implementations, one or more rinse or cleaning processes may be performed to clean the exposed source/drain features 238. With reference to FIGS. 9A-9B, one or more source/drain contacts 256 are formed in the contact openings 252. In this depicted example, to form the source/drain contact 256, a barrier layer (not separately labeled) is conformally deposited over the bottom ILD layer 244 and into the contact opening 252 using a suitable deposition technique, such as an ALD process, a PVD process or a CVD process, and then a metal fill layer (not separately labeled) is deposited over the barrier layer using a suitable deposition technique, such as a PVD process or a CVD process. The barrier layer may be formed of tungsten, ruthenium, cobalt, copper, molybdenum, titanium nitride, or tantalum nitride. The metal fill layer may be formed of tungsten, ruthenium, cobalt, copper, molybdenum, aluminum, or an alloy thereof. The source/drain contact 256 may also include a silicide layer interposing a conductive material of the source/drain contact 256 (e.g., W) and the source/drain features 238. By covering at least a portion of the second region 212b of the dielectric fin 212, a portion of the second region 212b remains undamaged during the formation of the source/drain trenches, and thus a portion of the source/drain contacts 256 directly lands on the recessed dielectric fin 212b' along the Z direction, the vertical reach of the source/drain contact 256 may be referred to as landing. Therefore, the landing of the source/drain contact 256 is raised by the recessed dielectric fin 212b', and an areal overlap between the source/drain contact 256 and the functional gate structure 248 is decreased, leading to a decreased parasitic capacitance between the source/drain contacts 256 and the functional gate structure 248.

Referring to FIG. 1 and FIGS. 9A-9B, method 10 includes a block 30 where further processes may be performed. Such further processes may include forming cut features for the source/drain contacts. Exemplary cut features (cut feature 405) are shown in alternative embodiments discussed with reference to FIG. 11B. Such further processes may also include forming interconnection structures for workpiece 200. For example, such further processes may include deposition of an interlayer dielectric (ILD) layer, formation of contact vias extending through the ILD layer to electrically connect to the source/drain features, formation of intermetal dielectric (IMD) layers, formation of metal lines, formation of power rails, and/or other suitable semiconductor device features. Such further processes may also include forming gate contact structures over the gate structures 248.

As described above, the IC technologies progress towards smaller technology nodes, and the thickness T of the dielectric fin 212 may be ranged between about 30 nm and about 70 nm. Although the material of forming dielectric fin 212 may be different from that of the device fins 206-209 to provide etch selectivity during the formation of source/drain trenches, the dielectric fin 212 can still be consumed during the etching process. Consumption of the dielectric fin 212 would lead to a deeper landing of the source/drain contact 256 and allow a greater areal overlap between the corresponding source/drain contact 256 and the adjacent gate structure, leading to an increased parasitic capacitance between source/drain contact 256 and the functional gate structure 248. In instances where two source/drain features are separated by a dielectric fin having a width (along the Y direction) less than a predetermined threshold PT, the consumption of the dielectric fin 212 may also result in bridging of the two source/drain features, leading to a short circuit. On the other hand, consumption of the dielectric fin 212 may have benefits. A deep landing and/or a larger volume of the source/drain contact 256 may lead to improved contact with the source/drain features 238, leading to reduced parasitic resistance.

Semiconductor devices for different applications may have different requirements with regards to parasitic capacitance and parasitic resistance. For example, in applications such as high-speed wireless/wire-line communication, a smaller parasitic capacitance may be desired since parasitic capacitance would disadvantageously limit the high-frequency performance of radio frequency ICs (RFICs) in the wireless/wire-line communication system. In these applications, reducing the parasitic capacitance takes precedence over reducing the parasitic resistance. In applications that peruse a low power consumption, a smaller parasitic resistance may be desired to achieve a lower power consumption, the direct current (DC) characteristics of the circuit may be advantageously improved. In these low-power-consumption application, reducing the parasitic resistance takes precedence over reducing the parasitic capacitance. By applying patterned masking layers with different configurations (e.g., width) according to the present disclosure, the parasitic resistance and parasitic capacitance associated with the source/drain contact may be adjusted accordingly such that the semiconductor device may achieve improved performance for its application.

FIG. 10 illustrates a flowchart of an exemplary method 300 of determining a configuration of the patterned masking layer to be formed during operations described in block 16 and to be used during operations described in block 18 of method 10. The configuration of the patterned masking layer 218 may include parameters that determine the volume of the recessed dielectric fin 212b'. For example, the parameters may include a width (along the Y direction) of the patterned masking layer and thickness of the patterned masking layer. By patterning the masking layer to have different configurations, the volume of the recessed dielectric fin (e.g., recessed dielectric fin 212b') and thus a volume of the source/drain feature and the landing of the source/drain contacts would vary accordingly. By changing the volume of the recessed dielectric fin, the parasitic resistance and the parasitic capacitance associated with the source/drain contacts may be varied according to the application of the resulting semiconductor device. Method 300 in FIG. 10 will be described in conjunction with FIGS. 11A-11B, 12, 13, 14A-14B, 15A-15B, 16A-16C, and 17A-17B.

Referring to FIG. 10, method 300 includes a block 302 where a width of the dielectric fin is determined. In some embodiments, the width of the dielectric fin may be determined by computer simulation based on an IC design layout or by directly measuring the dielectric fin in a test sample. In the former, the computer simulation may be used to determine a width of the dielectric fin along the Y direction. In the latter, the measuring may be done with a variety of measurement tools such as a scanning electron microscope (SEM) or through transmission electron microscopy (TEM). In some embodiments, the width of the dielectric fin may be deducted by obtaining the dimensions of other features. For example, the width of the dielectric fin is a function of a thickness of the isolation feature 204 and a distance between the device fins 207 and 208.

Referring to FIG. 10, method 300 includes a block 304 where whether the width of the dielectric fin is greater than a predetermined threshold PT is determined. The predetermined threshold PT may be a function of the resolution limit of the photolithography and/or etching techniques. In some embodiments, the predetermined threshold PT is between about 5 nm and about 20 nm.

Still referring to FIG. 10, if the width of the dielectric fin is greater than the predetermined threshold PT, then the method 300 proceeds to block 306 where desired electrical characterizations of the semiconductor device are determined. As described above, there is a tradeoff between different electrical characterizations and/or performances of the semiconductor structure. By determining potential application (e.g., high-speed communication or low-power-consumption circuit) of the semiconductor device, corresponding desired electrical characterizations of the semiconductor device may be thus determined.

Referring to FIG. 10, the method 300 also includes a block 308 where a volume of a recessed dielectric fin (e.g., the volume V of the recessed dielectric fin 212b') is determined in response to the desired electrical characterizations. Still referring to FIG. 10, the method 300 also includes a block 310 where a configuration of the patterned photoresist layer to be used during the source/drain trenches is determined based on the determined volume of the recessed dielectric fin. The volume of the recessed dielectric fin inversely correlates to a volume of a source/drain contact to be formed in the semiconductor device and thus affect the electrical characterizations of the semiconductor device. More specifically, a recessed dielectric fin having a greater volume will lead to a smaller contact area between the source/drain feature and source/drain contact, causing a greater parasitic resistance. However, a recessed dielectric fin having a greater volume will also lead to a shallower landing of the source/drain contact, leading to a smaller parasitic capacitance between the source/drain contact and the functional gate structure. FIGS. 11A-11B, 12, 13, 14A-14B, and 15A-15B depict different exemplary semiconductor structures with various electrical characterizations. A corresponding mask may be used during the photolithography process described at block 16 of FIG. 1 to form the patterned photoresist layer with a determined configuration.

Figure 11A:
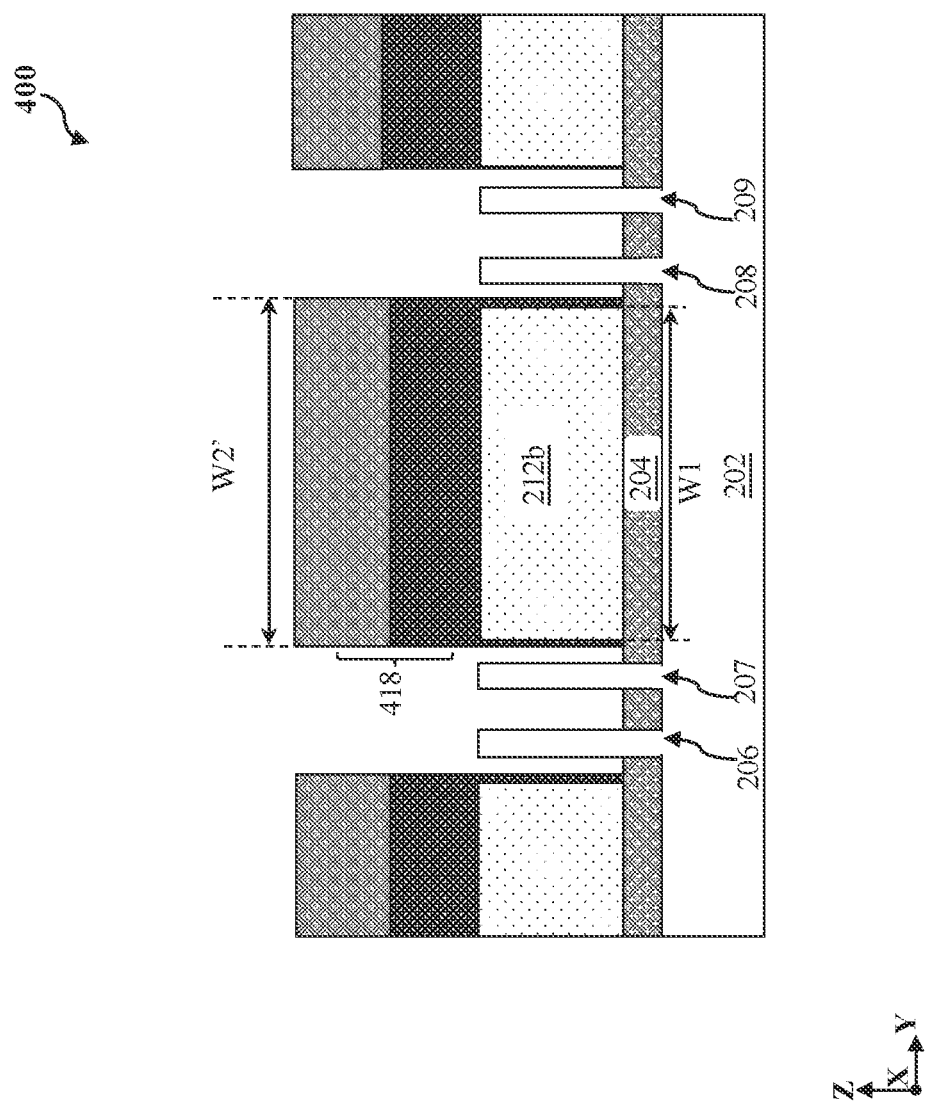
FIGS. 11A and 11B illustrate a first alternative embodiment of the semiconductor structure, according to one or more aspects of the present disclosure.
Figure 11B:
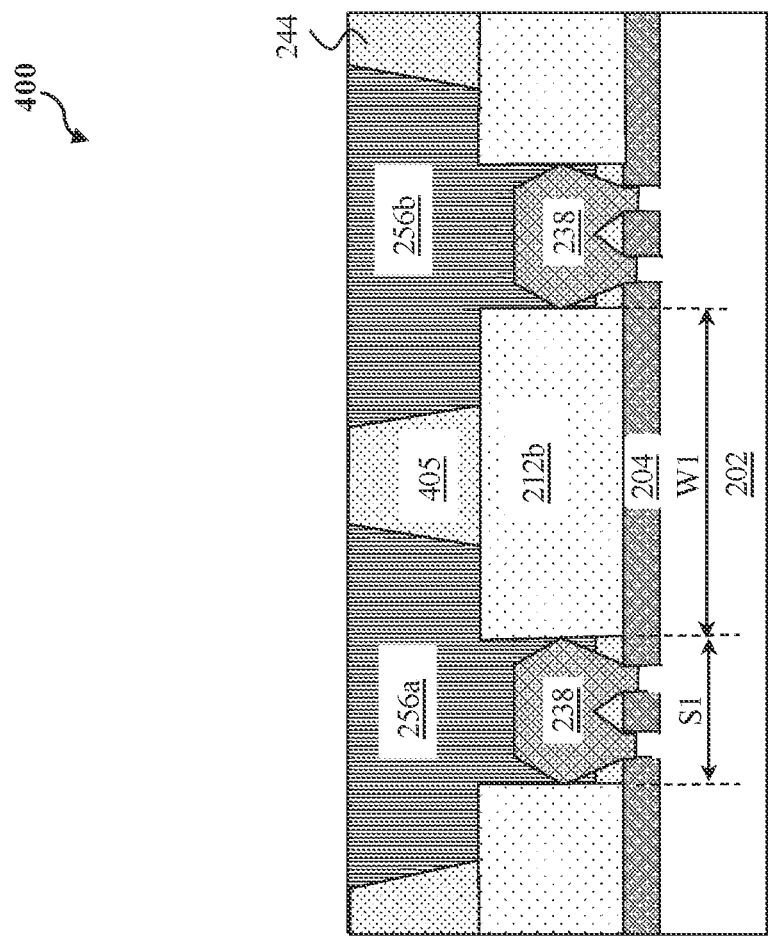

FIGS. 11A-11B depict a first alternative embodiment where a workpiece 400 employs a patterned masking layer with a first configuration. Referring to FIG. 11A, the workpiece 400 includes a patterned masking layer 418 formed over the substrate 202. A width W2' of the patterned masking layer 418 is greater than the width W1 of the dielectric fin 212 and the patterned masking layer 418 fully covers the second region 212b of the dielectric fin 212. In embodiments represented in FIG. 11B, after the source/drain region recess processes, the second region 212b of the dielectric fin 212 remains substantially intact and has a volume V1 greater than the volume V of the recessed second region 212b'. Therefore, the semiconductor device 400 in FIG. 11B has a smaller parasitic capacitance than that of the workpiece 200 and may be applied in the high-speed wireless/wire-line communication. On the flip side, the greater volume of the dielectric fin 212 may reduce the contact area between a to-be-formed source/drain contact and the to-be-formed source/drain feature, resulting in increased parasitic resistance.

Still referring to FIG. 11B, the semiconductor device 400 may further include a cut feature 405 configured to divide the source/drain contact 256 into two electrically isolated contact features 256a and 256b. Suitable processes may be performed to form the cut feature 405. For example, while forming the contact openings 252, the ILD layer 244 is also patterned to form the cut feature 405 on the second region 212b of the dielectric fin 212. In some embodiments, the cut feature 405 may include silicon oxide, silicon oxycarbonitride, silicon nitride, a low-k dielectric material, or a combination thereof.

Figure 12:
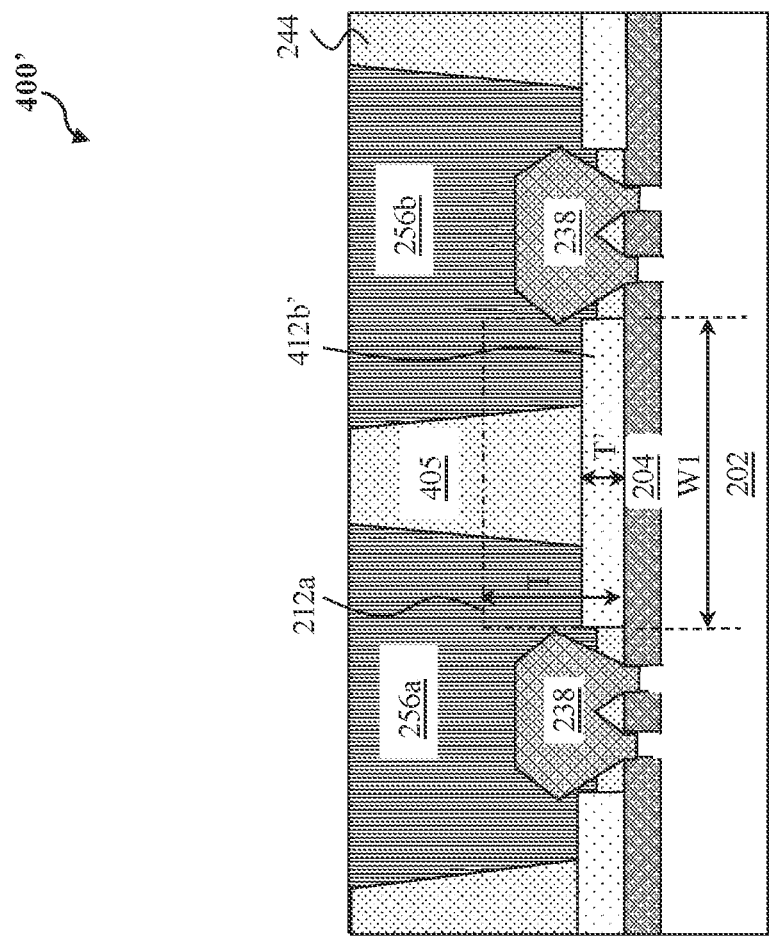
FIG. 12 illustrates a second alternative embodiment of the semiconductor structure, according to one or more aspects of the present disclosure.

FIG. 12 depicts a second alternative embodiment where a semiconductor device 400' is fabricated without employing a patterned masking layer over the dielectric fin. In embodiments presented in FIG. 12, without a patterned masking layer protecting the dielectric fin during the source/drain region recess processes, the semiconductor structure 400' has a recessed dielectric fin 412b' with a volume V2 smaller than the volume V1 of the second region 212b of the dielectric fin 212 and/or the volume V of the recessed dielectric fin 212b' shown in FIG. 9B. As shown in FIG. 12, a height T' of the recessed second region 412b' is less than a height T of the first region 212a of the dielectric fin 212. In an embodiment, T' is between about 0 nm and about 40 nm. A contact area between the source/drain contact 256a and the source/drain feature 238 is greater than that of the workpiece 200, leading to a smaller parasitic resistance. Thus, the semiconductor device 400' may be implemented in the low-power-consumption applications.

When neither parasitic capacitance nor parasitic resistance takes precedence for the desired application, the workpiece may employ a patterned masking layer with a predetermined configuration such that each of the parasitic resistance and the parasitic capacitance is in a corresponding tolerable range. The workpiece 200 shown in FIG. 9B is one of these examples and the volume V of the recessed dielectric fin 212b' is greater than volume V2 but less than volume V1. These embodiments may achieve a balance between parasitic capacitance and parasitic resistance. FIGS. 13, 14A-14B and 15A-15B depict other alternative embodiments where neither parasitic capacitance nor parasitic resistance is more desirable.

Figure 13:
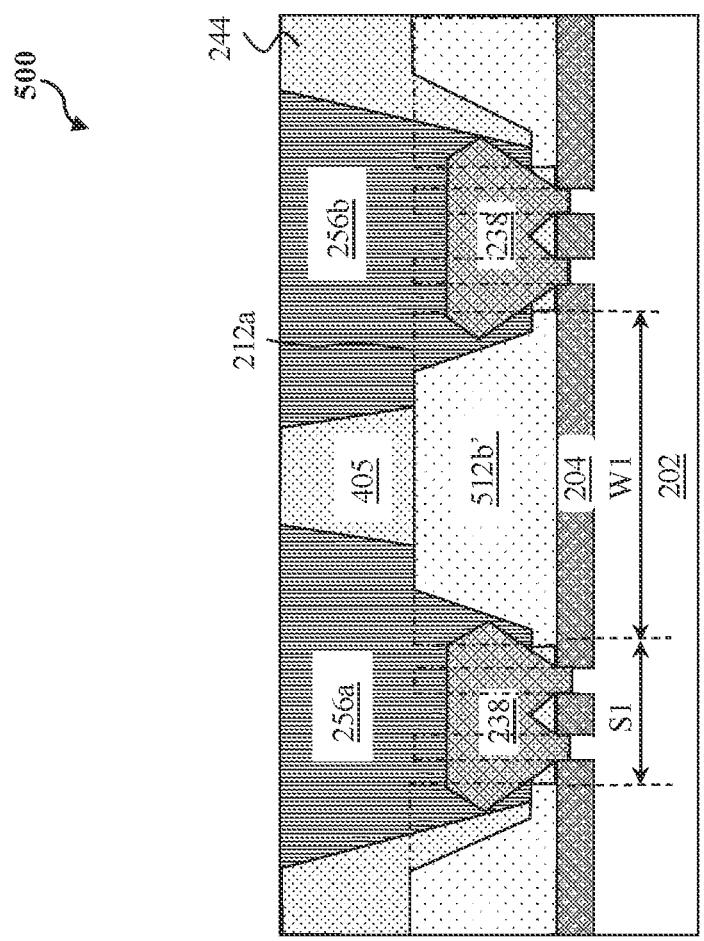
FIG. 13 illustrates a third alternative embodiment of the semiconductor structure, according to one or more aspects of the present disclosure.

Referring to FIG. 13, a semiconductor device 500 is a fabricated using a patterned masking layer having the same configuration as the patterned masking layer 218 discussed with reference to FIG. 4B. It is noted that, a shape of the cross-sectional view of a recessed dielectric fin 512b' is different from that of the recessed dielectric fin 212b'. This difference may be a result of different etching processes employed in the formation of source/drain trenches. It is further noted that, the ILD layer 244 is patterned to have a source/drain contact opening smaller than the contact opening 252 shown in FIG. 8B. Therefore, the area of the source/drain contact and the electrical characterizations of the semiconductor device may be further adjusted by adjusting the size of the contact openings.

Figure 14A:
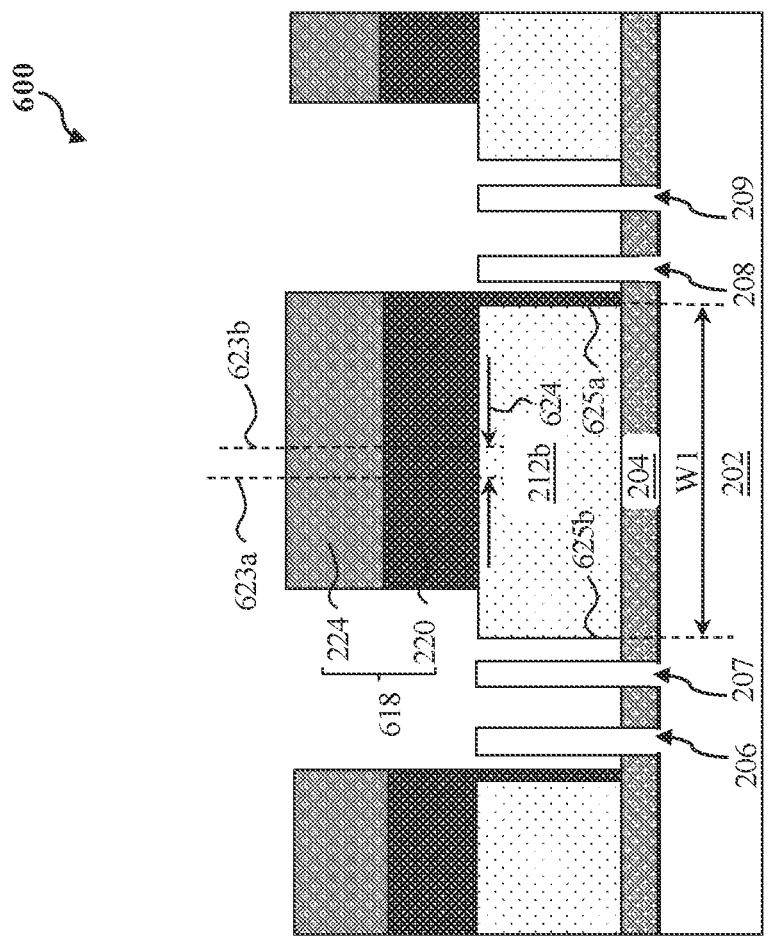
FIGS. 14A and 14B illustrate a fourth alternative embodiment of the semiconductor structure, according to one or more aspects of the present disclosure.
Figure 14B:
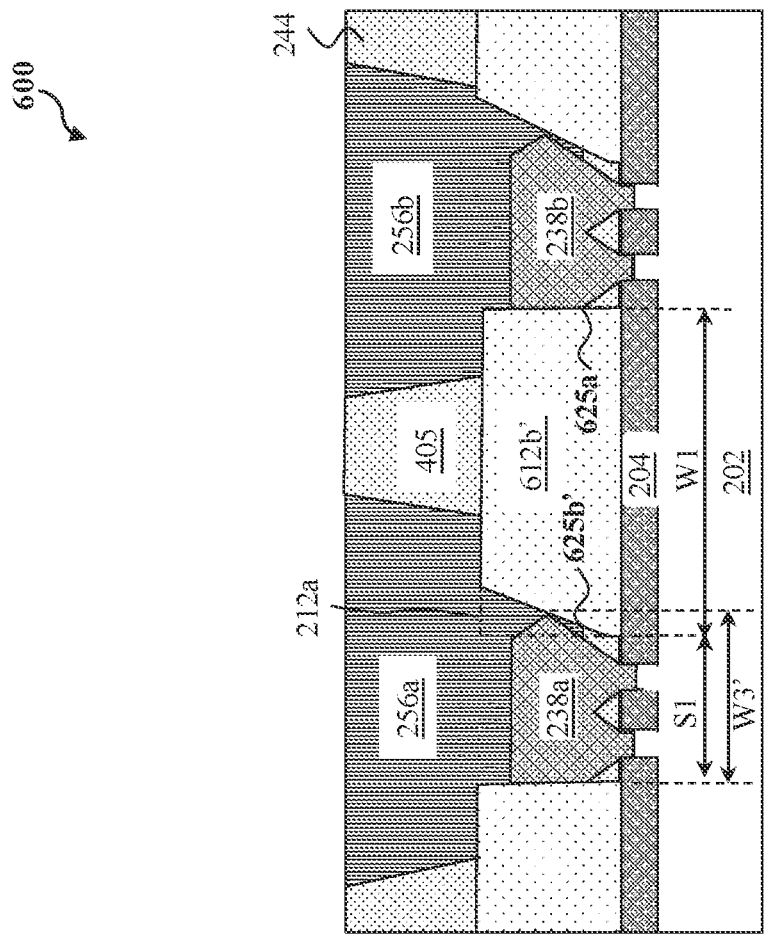

Referring to FIG. 14A, the second region 212b of the dielectric fin 212 in workpiece 600 is partially covered by a patterned masking layer 618. It is noted that, different from the patterned masking layer 218 shown in FIG. 4B, a center line 623b of the patterned masking layer 618 is offset from a center line 623a of dielectric fin 212. The offset 624 may be a result of a misalignment during the mask aligning in the lithography process. A sidewall 625a of the second region 212b of the dielectric fin 212 is covered by the patterned masking layer 618, and an opposite sidewall 625b is uncovered. With reference to FIG. 14B, after the formation of the source/drain trenches, the recessed dielectric fin 612b' includes the substantially intact vertical sidewall 625a and a tilted sidewall 625b'. In FIG. 14B, the source/drain feature 238a adjacent the tilted sidewall 625b' may have a portion disposed directly over the tilted sidewall 625b' while the vertical sidewall 625a defines a vertical wall of a source/drain feature 238b. A width W3' (along the Y direction) of the source/drain feature 238a is greater than the distance S1. The source/drain feature 238b is electrically isolated from the source/drain feature 238a by way of the recessed dielectric fin 612b' and the cut feature 405 disposed over the dielectric fin 612b'.

Figure 15A:
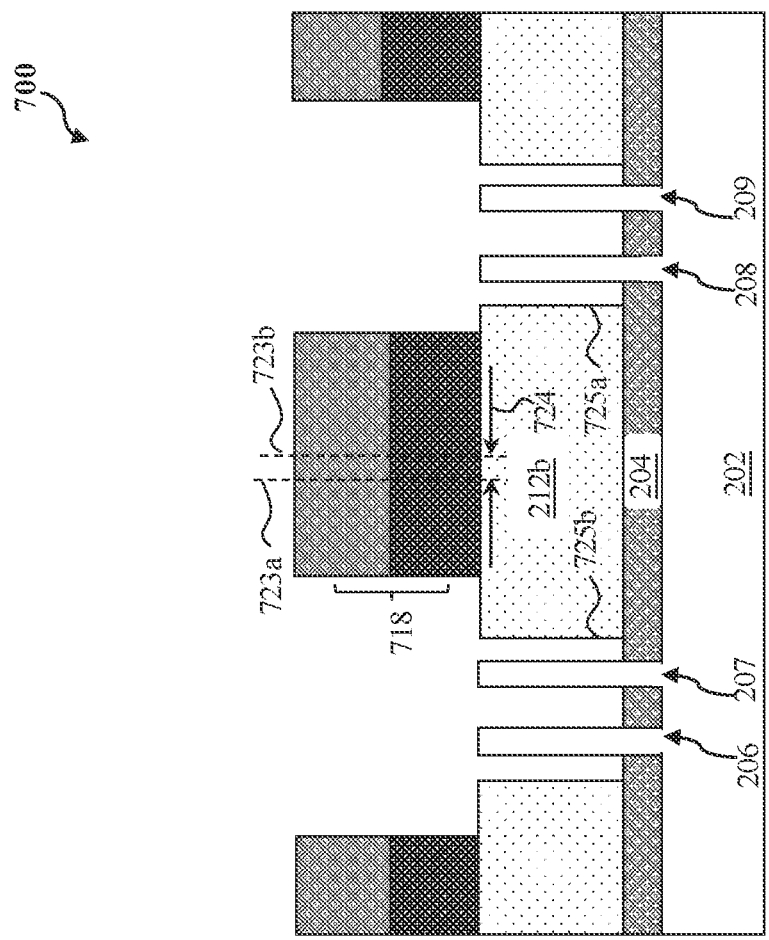
FIGS. 15A and 15B illustrate a fifth alternative embodiment of the semiconductor structure, according to one or more aspects of the present disclosure.
Figure 15B:
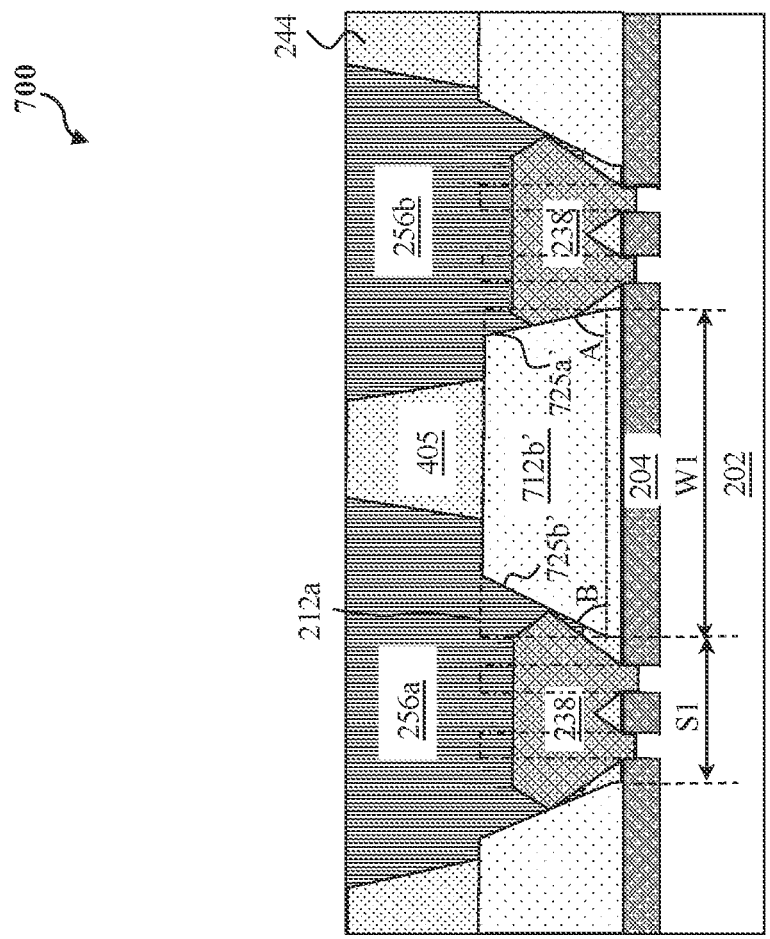

Referring to FIG. 15A, the second region 212b of the dielectric fin 212 in workpiece 700 is partially covered by a patterned masking layer 718. A width of the patterned masking layer 718 is less than the width W1 of the dielectric fin 212 and two sidewalls 725a-725b of the second region (i.e., the region not protected by a dummy gate stack) of the dielectric fin 212 are not covered by the patterned masking layer 718. There is an offset 724 between a center line 723b of the patterned masking layer 718 and a center line 723a of the dielectric fin 212. With reference to FIG. 15B, after the formation of the source/drain trenches, the recessed dielectric fin 712b' includes a tilted sidewall 725a' and a tilted sidewall 725b'. Due to the offset 724, an angle A between the tilted sidewall 725a' and the Y axis is greater than an angle B between the tilted sidewall 725b' and the Y axis. FIG. 15B also illustrates a cut feature 405 that separates the source/drain contacts 256a and 256b from one another.

Now referring back to FIG. 10, at the block 304, when the width of the dielectric fin is no greater than the predetermined threshold PT, then method 300 includes, at block 312, determining a configuration of a portion of the patterned masking layer to be used during the formation of the source/drain trenches such that the corresponding patterned masking layer would fully cover the second region (i.e., the region not protected by a dummy gate stack) of the dielectric fin. As described above, besides lifting the landing of the source/drain contact, dielectric fins may also be used to prevent the bridging of two adjacent epitaxial source/drain features. A corresponding mask may be used during the photolithography process described at block 16 of FIG. 1 to form the patterned photoresist layer with a determined configuration. By forming a patterned masking layer fully covers the dielectric fin, the dielectric fin would not be damaged during the formation of the source/drain trench. Exemplary cross-sectional views of a workpiece with a dielectric fin whose width is no greater than the predetermined threshold PT are shown in FIGS. 16A-16C.

Figure 16B:
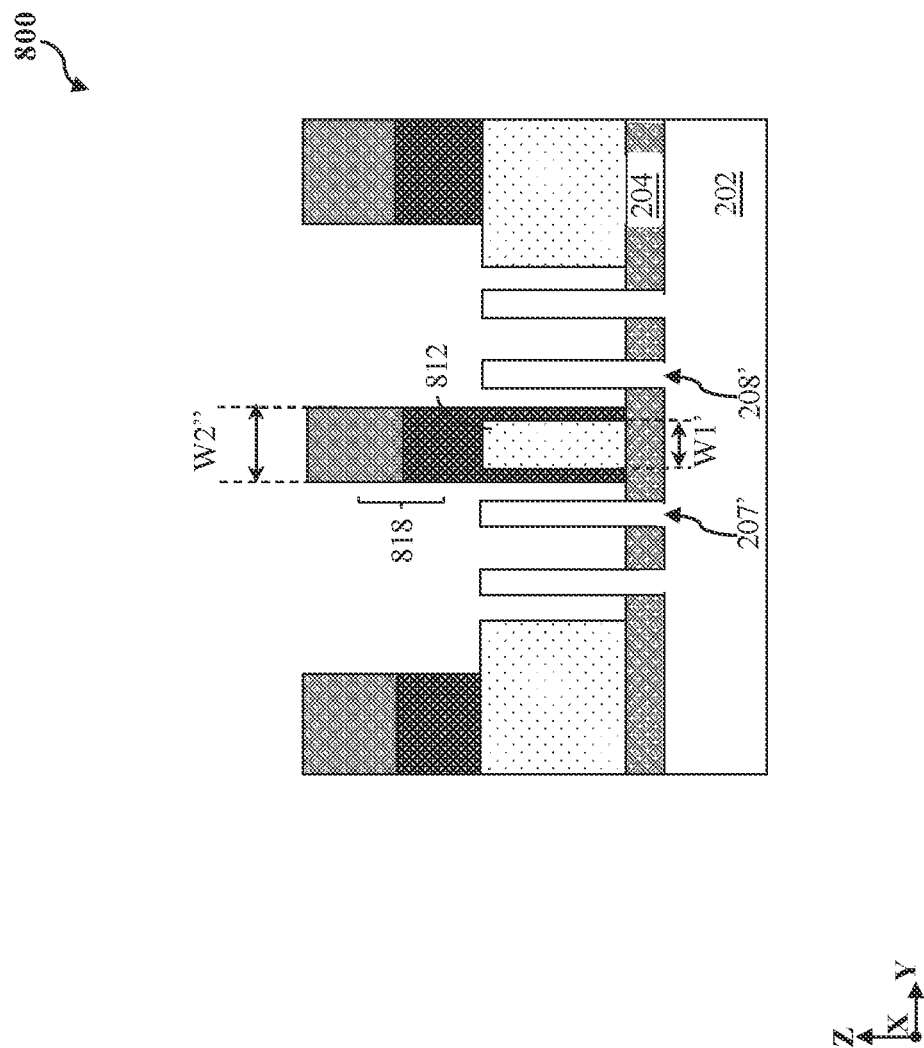
Figure 16C:
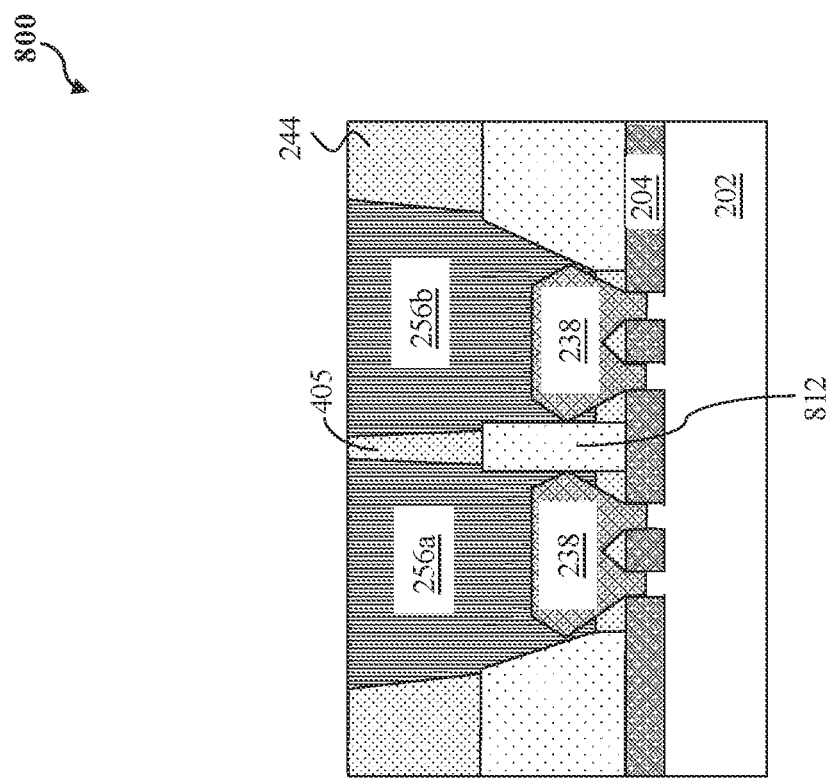

Referring to FIG. 16A, a workpiece 800 includes a dielectric fin 812 disposed between a first group of device fins and a second group of device fins. The first group includes device fins 206' and 207', and the second group includes 208' and 209'. It is noted that, a width W1' of the dielectric fin is less than the predetermined threshold PT. With reference to FIG. 16B, a patterned masking layer 818 is formed over the workpiece 800. To prevent undesirable bridging of two adjacent epitaxial source/drain features, a width W2" of the patterned masking layer 818 is no less than W1'. In this depicted example, W2" is greater than W1'. With reference to FIG. 16C, the source/drain features 238 are electrically isolated by the dielectric fin 812. Thus, bridging between source/drain features is advantageously prevented. FIG. 16C also illustrates a cut feature 405 disposed over the dielectric fin 812. The cut feature 405 isolates the source/drain contact 256a from the source/drain contact 256b.

Method 10 and method 300 are described with respect to FinFETs that have devices fins as active regions. Embodiments of the present disclosure may be applied to other multi-gate devices. FIGS. 17A and 17B illustrate embodiments where method 10 and method 300 may be applied in fabrication of MBC transistors on a workpiece 900. Instead of device fins, the workpiece 900 includes fin-shaped structures, each of which includes silicon layers 908 interleaved by silicon germanium layers (not shown). To prevent bridging of adjacent source/drain features and to facilitate separating different source/drain contacts, the workpiece 900 may also include dielectric fins. When method 10 is followed to form the MBC transistor on the workpiece 900, source/drain regions of fin-shaped structure may be recessed at block 18 while channel regions of the fin-shaped structures are covered by a dummy gate structure. Before the patterning process and the source/drain region recess processes, method 300 may be followed to determine a configuration of a patterned masking layer over the dielectric fin to form the recessed dielectric fin 912b', shown in FIG. 17B. After the source/drain region recess processes, source/drain features 938 are epitaxially deposited over surfaces of the substrate 202 as well as sidewalls of the silicon layers 908. The recessed dielectric fin 912b' and other recessed dielectric fin define the boundaries of the source/drain features 938. After the dummy gate structure is removed and the silicon germanium layers are selectively removed with the help of inner spacer features 914, the silicon layers 908 in the fin-shaped structures are released as channel members 908. The channel members 908 may come in shapes of nanowires, nanosheets, or nanostructure. A gate structure 948 is then formed to wrap around each of the channel members 908. The channel members 908 extend between two source/drain features 938 along the gate length direction.

According to the present disclosure, application of method 10 and method 300 may result in different configurations of patterned masking layers being used in different device regions. By way of example, FIG. 18 illustrates a schematic diagram of an exemplary integrated circuit 1000 including a first device region 1002, a second device region 1004, a third device region 1006, and a fourth device region 1008. Semiconductor devices in these four device regions may be fabricated according to method 10 and method 300 to fit their design requirements. In one example, semiconductor devices in the first device region 1002 may be low-power-consumption devices and may have deep source/drain contact landing shown in FIG. 12 to achieve low parasitic resistance; semiconductor devices in the second device region 1004 may be high-speed devices and may have shallow source/drain contact landing shown in FIG. 11B to achieve low to achieve parasitic capacitance; semiconductor devices in the third device region 1006 may provide a balance between parasitic capacitance and parasitic resistance and have partially recessed dielectric fins as shown in FIG. 9B, 13B, 14B, or 15B; and semiconductor devices in the fourth device region 1008 may include narrow dielectric fins like those shown in FIGS. 16A and 16B. In still other embodiments not explicitly shown, more than one configurations of patterned masking layer may be applied in a single device region.

One aspect of the present disclosure involves a method. The method includes receiving a workpiece comprising a first semiconductor element and a second semiconductor element and a dielectric fin disposed between the first semiconductor element and the second semiconductor element, forming a masking layer over the dielectric fin, after the forming of the masking layer, etching the first semiconductor element and the second semiconductor element to form a first recess and a second recess, and forming a first source/drain feature and a second source/drain feature in the first recess and the second recess, respectively.

In some implementations, the etching also removes a portion of the dielectric fin not covered by the masking layer. In some embodiments, after the forming of the first source/drain feature in the first recess, a portion of the first source/drain feature may be disposed directly over a portion of the dielectric fin. In some embodiments, a width of the masking layer may be less than a width of the dielectric fin.

In some instances, the method may also include, before the forming of the masking layer, forming a first gate structure over the first semiconductor element, the second semiconductor element, and the dielectric fin. The method may also include, after the forming of the first and the second source/drain features, forming an interlayer dielectric layer over the workpiece, and replacing the first gate structure with a second gate structure. A height of a first portion of the dielectric fin under the second gate structure may be greater than a height of a second portion of the dielectric fin not covered by the masking layer.

In some implementations, the forming of the masking layer over the dielectric fin may include depositing an anti-reflection coating layer over the workpiece, depositing a photoresist layer over the anti-reflection coating layer, and patterning the photoresist layer and the anti-reflection coating layer to form the masking layer over the dielectric fin.

In some implementations, the method may also include before the patterning of the photoresist layer and the anti-reflection coating layer and determining a width of the masking layer. The determining may include identifying a desired parasitic capacitance associated with a source/drain contact feature to be formed over the workpiece, determining a volume of a portion of the dielectric fin to be remained after the etching in response to the desired parasitic capacitance, and determining the width of the masking layer in response to the determined volume of the portion of the dielectric fin.

In some embodiments, the method may also include identifying a desired parasitic resistance associated with a source/drain feature to be formed over the workpiece. In some embodiments, the dielectric fin may include silicon nitride, silicon oxycarbonitride, silicon oxycarbide, hafnium oxide, zirconium oxide, and lanthanum oxide. In some embodiments, a center line of the masking layer over the dielectric fin may be offset from a center of the dielectric fin.

Another aspect of the present disclosure involves a method. The method includes forming a first semiconductor structure and a second semiconductor structure over a substrate, forming a dielectric fin between the first semiconductor structure and the second semiconductor structure, depositing a photoresist layer over the substrate, patterning the photoresist layer, the patterned photoresist layer is directly over a portion of the dielectric fin, performing an etching process on the first semiconductor structure and the second semiconductor structure to form a first recess and a second recess, respectively, and, epitaxially forming a first source/drain feature and a second source/drain feature in the first recess and the second recess, respectively. At least a portion of the first source/drain feature is disposed over a portion of the dielectric fin.

In some embodiments, the method may also include after the forming of the first source/drain feature and the second source/drain feature, forming a dielectric layer over the substrate, patterning the dielectric layer to form a cut feature over the dielectric fin, depositing a conductive layer over the substrate, and planarizing the conductive layer to expose a top surface of the cut feature to divide the conductive layer into a first source/drain contact over the first source/drain feature and a second source/drain contact over the second source/drain feature.

In some embodiments, the method may also include before the depositing of the photoresist layer, forming a first gate structure over a corresponding region of the first semiconductor structure, the second semiconductor structure, and the dielectric fin, after the forming of the first and the second source/drain features, forming an interlayer dielectric layer over the substrate, and replacing the first gate structure with a second gate structure, a height of a first portion of the dielectric fin wrapped around by the second gate structure is greater than a height of a second portion of the dielectric fin not covered by the photoresist layer.

In some embodiments, the first semiconductor structure may include a first semiconductor fin and a second semiconductor fin separated by an isolation structure (STI), the second semiconductor structure may include a third semiconductor fin and a fourth semiconductor fin separated by the isolation structure, and the performing of the etching process partially removes the first semiconductor fin and the second semiconductor fin to form the first recess and partially removes the third semiconductor fin and the fourth semiconductor fin to form the second recess.

In some embodiments, the first semiconductor structure and the second semiconductor structure each may include a stack comprising a plurality of channel layers interleaved by a plurality of sacrificial layers. In some embodiments, the method may also include forming a dummy gate stack over a first channel region of the first semiconductor structure, a second channel region of the first semiconductor structure, and a first region of the dielectric fin, after the forming of the first source/drain feature and the second source/drain feature, removing the dummy gate stack, selectively removing the plurality of sacrificial layers in the first channel region and the second channel region, and forming a gate structure over first channel region and the second channel region.

Still another aspect of the present disclosure involves a semiconductor structure. The semiconductor structure includes a first semiconductor element over a substrate, the first semiconductor element comprises a first channel region and a first source/drain region adjacent to the first channel region, a first epitaxial source/drain feature over the first source/drain region, a second semiconductor element over the substrate, the second semiconductor element comprises a second channel region and a second source/drain region adjacent to the second channel region, a second epitaxial source/drain feature over the second source/drain region, a dummy fin structure disposed between the first semiconductor element and the second semiconductor element and having a first region and a second region, and a gate structure directly over the first channel region, the second channel region, and the first region, a height of the first region is greater than a height of a portion of the second region.

In some embodiments, a portion of the first epitaxial source/drain feature may be disposed over a portion of the second region. In some embodiments, the dummy fin structure may include a top surface having a first width and a bottom surface having a second width greater than the first width, and a distance between the first epitaxial source/drain feature and the second epitaxial source/drain feature may be less than the second width.

In some embodiments, the semiconductor structure may also include a first source/drain contact disposed over the first epitaxial source/drain feature, a second source/drain contact disposed over the second epitaxial source/drain feature, and a cut feature disposed on the dummy fin structure, the first source/drain contact may be spaced apart from the second source/drain contact by the cut feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece comprising:
a first semiconductor element and a second semiconductor element, and
a dielectric fin disposed between the first semiconductor element and the second semiconductor element;
forming a masking layer over the dielectric fin, wherein the forming of the masking layer over the dielectric fin comprises:
depositing an anti-reflection coating layer over the workpiece;
depositing a photoresist layer over the anti-reflection coating layer; and
patterning the photoresist layer and the anti-reflection coating layer to form the masking layer over the dielectric fin;
after the forming of the masking layer, etching the first semiconductor element and the second semiconductor element to form a first recess and a second recess; and
forming a first source/drain feature and a second source/drain feature in the first recess and the second recess, respectively.

2. The method of claim 1, wherein the etching further removes a portion of the dielectric fin not covered by the masking layer.

3. The method of claim 1, wherein after the forming of the first source/drain feature in the first recess, a portion of the first source/drain feature is disposed directly over a portion of the dielectric fin.

4. The method of claim 3, wherein a width of the masking layer is less than a width of the dielectric fin.

5. The method of claim 1, further comprising:
before the forming of the masking layer, forming a first gate structure over the first semiconductor element, the second semiconductor element, and the dielectric fin;
after the forming of the first source/drain feature and the second source/drain feature, forming an interlayer dielectric layer over the workpiece; and
replacing the first gate structure with a second gate structure,
wherein a height of a first portion of the dielectric fin under the second gate structure is greater than a height of a second portion of the dielectric fin not covered by the masking layer.

6. The method of claim 1, further comprising:
before the patterning of the photoresist layer and the anti-reflection coating layer, determining a width of the masking layer, wherein the determining comprises:
identifying a desired parasitic capacitance associated with a source/drain contact feature to be formed over the workpiece;
determining a volume of a portion of the dielectric fin to remain after the etching in response to the desired parasitic capacitance; and
determining the width of the masking layer in response to the volume of the portion of the dielectric fin.

7. The method of claim 6, further comprising:
identifying a desired parasitic resistance associated with a source/drain feature to be formed over the workpiece.

8. The method of claim 1, wherein the dielectric fin comprises at least one of silicon nitride, silicon oxycarbonitride, silicon oxycarbide, hafnium oxide, zirconium oxide, or lanthanum oxide.

9. The method of claim 1, wherein a center line of the masking layer over the dielectric fin is offset from a center of the dielectric fin.

10. The method of claim 1, wherein the forming of the first source/drain feature comprises forming the first source/drain feature to overlie a portion of the dielectric fin.

11. A method, comprising:
forming a first semiconductor structure and a second semiconductor structure over a substrate;
forming a dielectric fin between the first semiconductor structure and the second semiconductor structure;
depositing a photoresist layer over the substrate;
patterning the photoresist layer to yield a patterned photoresist layer, wherein the patterned photoresist layer is directly over a first portion of the dielectric fin;
performing an etching process on the first semiconductor structure and the second semiconductor structure to form a first recess and a second recess, respectively; and
epitaxially forming a first source/drain feature and a second source/drain feature in the first recess and the second recess, respectively,
wherein at least a portion of the first source/drain feature is disposed over a second portion of the dielectric fin.

12. The method of claim 11, further comprising:
after the forming of the first source/drain feature and the second source/drain feature, forming a dielectric layer over the substrate;
patterning the dielectric layer to form a cut feature over the dielectric fin;
depositing a conductive layer over the substrate; and
planarizing the conductive layer to expose a top surface of the cut feature to divide the conductive layer into a first source/drain contact over the first source/drain feature and a second source/drain contact over the second source/drain feature.

13. The method of claim 11, further comprising:
before the depositing of the photoresist layer, forming a first gate structure over a corresponding region of the first semiconductor structure, the second semiconductor structure, and the dielectric fin;
after the forming of the first source/drain feature and the second source/drain feature, forming an interlayer dielectric layer over the substrate; and
replacing the first gate structure with a second gate structure, wherein a height of a third portion of the dielectric fin wrapped around by the second gate structure is greater than a height of a fourth portion of the dielectric fin not covered by the photoresist layer.

14. The method of claim 13, wherein
the first semiconductor structure comprises a first semiconductor fin and a second semiconductor fin separated by an isolation structure (STI),
the second semiconductor structure comprises a third semiconductor fin and a fourth semiconductor fin separated by the isolation structure, and
the performing of the etching process partially removes the first semiconductor fin and the second semiconductor fin to form the first recess and partially removes the third semiconductor fin and the fourth semiconductor fin to form the second recess.

15. The method of claim 11, wherein the first semiconductor structure and the second semiconductor structure each comprises a stack comprising a plurality of channel layers interleaved by a plurality of sacrificial layers.

16. The method of claim 15, further comprising:

forming a dummy gate stack over a first channel region of the first semiconductor structure, a second channel region of the first semiconductor structure, and a first region of the dielectric fin;

after the forming of the first source/drain feature and the second source/drain feature, removing the dummy gate stack;

selectively removing the plurality of sacrificial layers in the first channel region and the second channel region; and forming a gate structure over the first channel region and the second channel region.

17. A method, comprising:

forming a first semiconductor fin and a second semiconductor fin protruding from a substrate;

forming a dielectric fin disposed between the first semiconductor fin and the second semiconductor fin, the dielectric fin having a first height and a top surface of a first width;

forming a mask element covering a portion of the dielectric fin;

after the forming of the mask element, performing an etching process to etch the first semiconductor fin and the second semiconductor fin, thereby forming a first source/drain trench and a second source/drain trench, respectively, wherein the performing of the etching process further reduces the first width without reducing the first height; and after the performing of the etching process, forming a first source/drain feature and a second source/drain feature in the first source/drain trench and the second source/drain trench, respectively.

18. The method of claim 17, wherein, after the performing of the etching process, a portion of a sidewall of the dielectric fin is a tilted surface.

19. The method of claim 17, wherein a portion of the first source/drain feature and a portion of the second source/drain feature are disposed directly over a lower portion of the dielectric fin.

20. The method of claim 17, further comprising:

after the forming of the first source/drain feature and the second source/drain feature, forming a source/drain contact disposed over and electrically coupled with the first source/drain feature and the second source/drain feature, wherein a portion of the source/drain contact is disposed directly over the dielectric fin.

* * * * *